(12) United States Patent
Yajima

(10) Patent No.: US 9,983,480 B2
(45) Date of Patent: May 29, 2018

(54) METHOD OF MANUFACTURING A STRUCTURE ON A SUBSTRATE

(71) Applicant: USHIO DENKI KABUSHIKI KAISHA, Tokyo (JP)

(72) Inventor: Daisuke Yajima, Tokyo (JP)

(73) Assignee: USHIO DENKI KABUSHIKI KAISHA, Tokyo (JP)

( * ) Notice: Subject to any disclaimer, the term of this patent is extended or adjusted under 35 U.S.C. 154(b) by 0 days. days.

(21) Appl. No.: 15/270,422

(22) Filed: Sep. 20, 2016

(65) Prior Publication Data

US 2017/0090289 A1    Mar. 30, 2017

(30) Foreign Application Priority Data

Sep. 24, 2015 (JP) .................................. 2015-187429

(51) Int. Cl.
*G03H 1/04* (2006.01)
*G03F 7/22* (2006.01)
(Continued)

(52) U.S. Cl.
CPC ................ *G03F 7/201* (2013.01); *G03F 7/16* (2013.01); *G03F 7/2006* (2013.01); *G03F 7/2008* (2013.01); *G03F 7/2022* (2013.01); *G03F 7/22* (2013.01); *G03F 7/26* (2013.01); *G03H 1/0244* (2013.01); *G03F 1/50* (2013.01); *G03H 1/0465* (2013.01)

(58) Field of Classification Search
None
See application file for complete search history.

(56) References Cited

U.S. PATENT DOCUMENTS 3,650,605 A * 3/1972 Little, Jr. ................. G02B 5/32
                                                        359/15
3,813,685 A * 5/1974 St. John .................. G03H 1/10
                                                        348/41
(Continued)

FOREIGN PATENT DOCUMENTS

GB          2212935        * 8/1989
JP       2002-198301       * 7/2002
(Continued)

*Primary Examiner* — Martin J Angebranndt
(74) *Attorney, Agent, or Firm* — Studebaker & Brackett PC

(57) ABSTRACT

A method includes dividing a single beam emitted from a coherent light source into at least two branch beams, and causing the branch beams to cross each other at a predetermined interference angle thereby generating interference pattern. The method also includes irradiating a target surface of a substrate with the interference pattern. The method also includes dividing the target surface of the substrate into a plurality of predetermined shapes, and repeating a first substep of irradiating each predetermined shape with every shot of the interference pattern, and a second substep of conveying the substrate in a stepwise manner such that the predetermined shapes overlap each other in the stepwise manner. The method also includes causing a line-to-line pitch of the interference fringes in one of the predetermined shapes to align with the line-to-line pitch of the interference fringes in a next predetermined shape upon repeating the first and second substeps.

18 Claims, 15 Drawing Sheets

(51) Int. Cl.
*G03F 1/50* (2012.01)
*G03F 7/20* (2006.01)
*G03H 1/02* (2006.01)
*G03F 7/16* (2006.01)
*G03F 7/26* (2006.01)

(56) References Cited

U.S. PATENT DOCUMENTS

| | | | | |
|---|---|---|---|---|
| 4,402,571 A | * | 9/1983 | Cowan | G02B 5/1857 204/192.26 |
| 4,496,216 A | * | 1/1985 | Cowan | G02B 5/32 359/558 |
| 5,291,317 A | * | 3/1994 | Newswanger | G02B 5/1842 359/15 |
| 5,415,835 A | * | 5/1995 | Brueck | G03F 7/001 250/492.1 |
| 5,585,211 A | * | 12/1996 | Firstein | G03F 7/70558 250/492.3 |
| 5,705,321 A | * | 1/1998 | Brueck | B82Y 10/00 257/E21.027 |
| 6,813,079 B2 | * | 11/2004 | Laming | G02B 6/02138 359/566 |
| 6,882,477 B1 | * | 4/2005 | Schattenburg | G03F 7/70383 359/35 |
| 7,867,692 B2 | | 1/2011 | Amako et al. | |
| 2002/0044358 A1 | * | 4/2002 | Laming | G02B 6/02138 359/570 |
| 2006/0263007 A1 | * | 11/2006 | Hsu | G02B 6/02133 385/37 |
| 2007/0023692 A1 | * | 2/2007 | Stenger | G03F 7/70408 250/492.2 |
| 2007/0274633 A1 | * | 11/2007 | Raub | B82Y 20/00 385/37 |
| 2009/0208876 A1 | * | 8/2009 | Hsu | G02B 6/02138 430/321 |
| 2011/0092007 A1 | * | 4/2011 | Lee | G02B 5/1857 438/32 |

FOREIGN PATENT DOCUMENTS

| | | |
|---|---|---|
| JP | 4514317 B2 | 7/2010 |
| JP | 4894899 B2 | 3/2012 |

\* cited by examiner

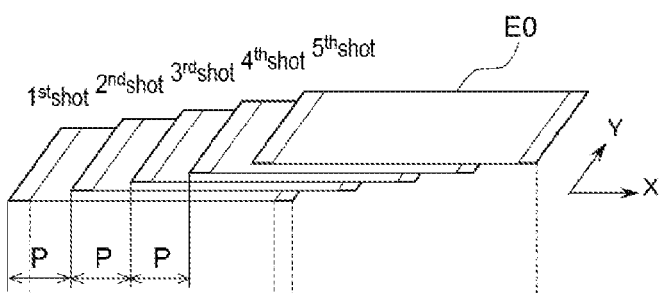
FIG. 4A
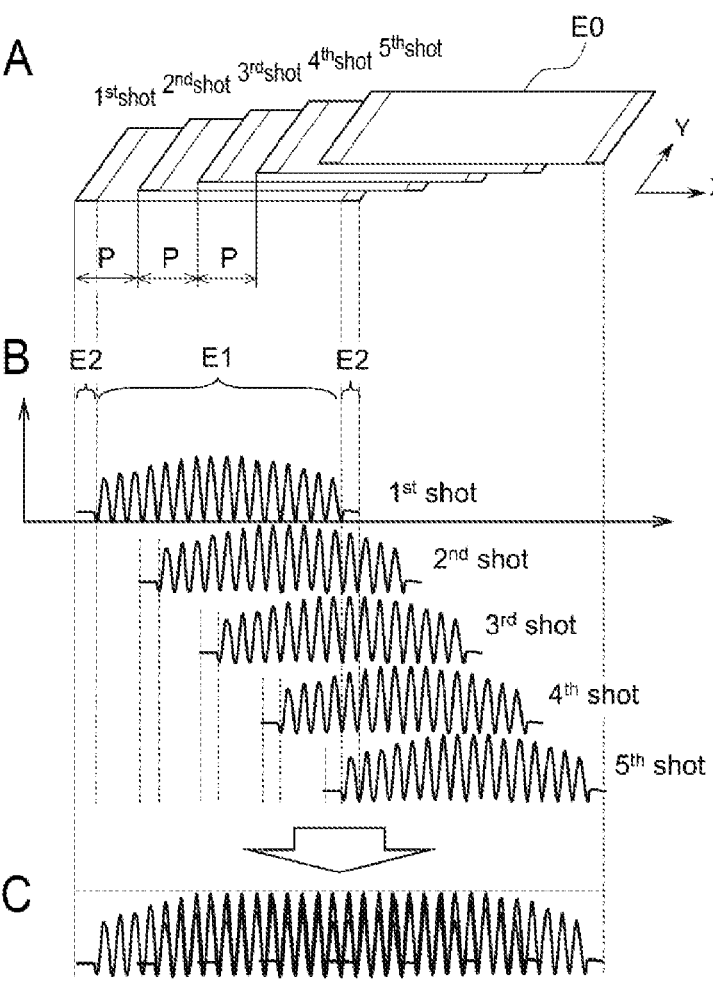
FIG. 4B
FIG. 4C

FIG. 11A
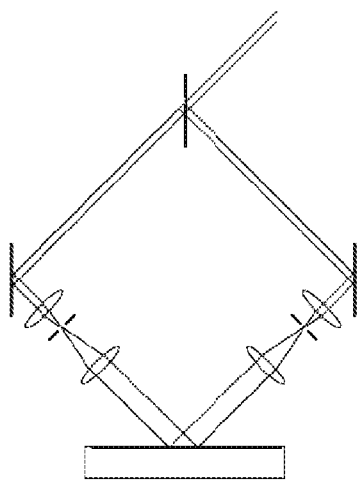
FIG. 11B
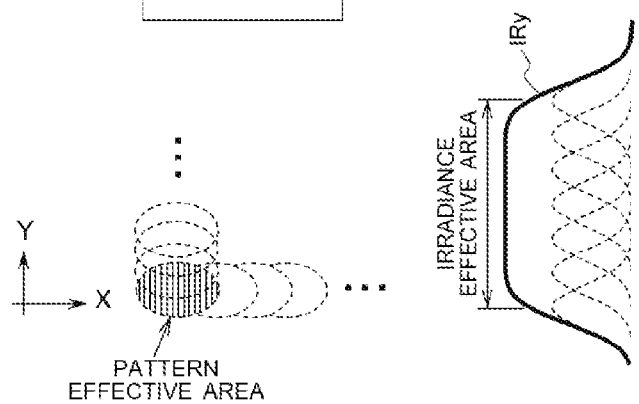
FIG. 11C
FIG. 11D
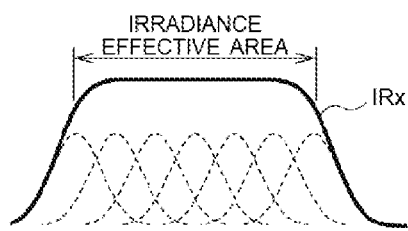

METHOD OF MANUFACTURING A STRUCTURE ON A SUBSTRATE

TECHNICAL FIELD

The present invention relates to a method of irradiating a substrate with a beam to make a fine pattern on a substrate. The present invention also relates to a method of manufacturing a fine structure on the substrate with such method, and further relates to such fine structure on the substrate.

BACKGROUND ART

Conventionally, a fine structure is made by an exposure method with a two-beam interference. The exposure method with the two-beam interference includes a step of causing two laser beams to cross each other at a predetermined angle, thereby generating an interference beam (interference fringes) that has a light-dark distribution (optical intensity distribution) with a pitch similar to or shorter than the wavelength of the laser beam, and a step of irradiating a substrate with the interference beam. The exposure method with the two-beam interference also includes a step of dividing a single beam, which is emitted from a light source having a strong coherent, such as a laser device, into two branch beams. The two branch beams are caused to interfere with each other. The exposure method with the two-beam interference does not use a fine mask, but is able to obtain a fine and periodical exposure illuminance distribution.

A method of manufacturing a fine structure with the exposure method with the two-beam interference is disclosed, for example, in Japanese Patent No. 4,894,899. The technology disclosed in Japanese Patent No. 4,894,899 includes a step of dividing a light beam from a laser light source into a 0 order light beam and ±1st order light beams by a diffraction beam splitter, a step of causing the ±1st order light beams to pass through the respective condenser lenses, the respective spatial filters, and the respective mirrors thereby directing the ±1st order light beams toward a substrate supported in a stage, a step of causing the ±1st order light beams to interfere with each other on the substrate, and a step of exposing a photosensitive film on the substrate. The stage is able to rotate. As the exposing process is performed twice, it is possible to obtain a fine structure that has a plurality of columns or cones arranged in a periodic fashion.

An exposure device that uses the exposure method with the two-beam interference is disclosed, for example, in Japanese Patent No. 4,514,317. The exposure device drives the stage in a stepwise manner, and performs the exposure process on the workpiece a plurality of times (i.e., performs the overlapping exposure) such that the exposure takes place in an overlapping manner. As a result, the exposure intensity distribution becomes flat (constant) in a certain area of the workpiece. When the exposure device performs the exposure process a plurality of times, the exposure device scans and controls the interference fringes in each exposure process such that the interference fringes overlap each other.

SUMMARY OF THE INVENTION

However, the method disclosed in Japanese Patent No. 4,894,899 uses a condenser lens and the spatial filter to expand the laser beam diameter, and irradiates the substrate with such laser beam. Thus, the laser beam is a spherical wave when the laser beam reaches the substrate for the exposure. The interference fringes generated on the substrate have an increasing pitch error near the edge of the exposure area because the pitch error is accumulated from the center of the exposure area to the edge of the exposure area.

Accordingly, an effective exposure area is limited to a center area of the laser beam and its vicinity when a diffraction grating, which requires an equal-interval line pattern (stripe pattern), is manufactured or when a much finer structure is manufactured. Therefore, if a large area should be exposed with the laser beam, there must be a large distance between the spatial filter to the substrate. This entails an increase in the device size and an increase in the cost.

The exposure device disclosed in Japanese Patent No. 4,514,317 does not expand the beam diameter, but uses parallel beams, which are obtained by a collimator lens. The exposure device disclosed in Japanese Patent No. 4,514,317 causes the parallel beams to overlap for the exposure. However, the lens has an aberration and there is an alignment error. Thus, the interference fringes are not always parallel at and/or near the beam edges. Because the beam edges are overlapped for the exposure in Japanese Patent No. 4,514,317, a structure formed on the substrate may have a defect in an area where the beam edges are overlapped.

An object of the present invention is to provide a method of irradiating a substrate having a large area with light beams to fabricate a fine structure on the large substrate without increasing the device size by causing interference fringes to overlap in an appropriate manner.

Another object of the present invention is to provide a method of manufacturing a fine structure on a substrate having a large area without increasing the device size.

Still another object of the present invention is to provide a fine structure on a substrate having a large area without increasing the device size.

According to one aspect of the present invention, there is provided a method of irradiating a substrate with light. The method includes dividing a single beam emitted from a coherent light source into at least two branch beams. The method also includes causing these branch beams to cross each other at a predetermined interference angle thereby generating an interference pattern. The method also includes irradiating a target surface of a substrate with the interference pattern. The step of irradiating the target surface includes repeating a first substep of irradiating the substrate with the interference pattern, and a second substep of conveying the substrate. The method also includes dividing the target surface of the substrate into a plurality of predetermined interference pattern areas based on a region of the substrate which is irradiated with a shot of the interference pattern. The first substep includes irradiating each of the predetermined interference pattern areas with every shot of the interference pattern. The second substep includes conveying the substrate in a stepwise manner such that the predetermined interference pattern areas overlap each other in the stepwise manner upon repeating the first substep and the second substep. The method also includes causing a line-to-line pitch of interference fringes in one of the predetermined interference pattern areas, made by one shot of the interference pattern, to align with the line-to-line pitch of the interference fringes in a next one of the predetermined interference pattern areas, made by a next shot of the interference pattern, upon repeating the first substep and the second substep.

Because small regions of the substrate are successively irradiated with the light while the substrate being conveyed in the stepwise manner, it is possible to irradiate a large substrate with the light without increasing the size of the exposure device. Thus, a cost increase which would otherwise be needed by the size increase of the exposure device is avoided. When the two-beam interference exposure is carried out, the areas of the substrate irradiated with the interference pattern are masked to the predetermined shapes. Thus, the edge portions of the interference pattern are not incident to the target surface of the substrate. The edge portions of the interference pattern do not have parallel interference fringes. Accordingly, it is possible to cause the interference pattern areas of the respective shots to partially overlap each other in a desired manner. Therefore, it is possible to irradiate the substrate with the interference pattern to form a structure, which continuously extends on a large surface of the large substrate.

The step of dividing the target surface may include masking the target surface, i.e., placing a light blocking member, which has a light transmitting portion having a predetermined shape, above the substrate with a predetermined gap in order to mask the target surface of the substrate to the predetermined interference pattern areas. When the first substep is performed to irradiate each predetermined interference pattern area with one shot of the interference pattern, neighboring areas of each predetermined interference pattern area in a first direction may be irradiated with part of the branch beams. This part of the branch beams may not include the interference pattern. The first direction may be a direction perpendicular to an extending direction of the interference fringes in each predetermined interference pattern area. One of the predetermined interference pattern areas may overlap the next predetermined interference pattern area such that the line-to-line pitch of interference fringes in one predetermined interference pattern area aligns with the line-to-line pitch of the interference fringes in the next predetermined interference pattern area in the first direction. The interference pattern areas overlap each other in the first direction, and the first direction is generally perpendicular to the extending direction of the interference fringes. Thus, it is possible to reduce the influences of those areas which are not irradiated with the interference pattern. It is possible to have a flat irradiance contribution in the first direction as the irradiance distributions are integrated in the first direction. Thus, the substrate is irradiated with the interference pattern that can precisely form the structure on the substrate.

The step of dividing a single beam may divide the single beam from the coherent light source into two branch beams, and the step of causing the two or more branch beams may cause the two branch beams to cross each other at the predetermined interference angle thereby generating the interference pattern. Each predetermined interference pattern area made by the step of masking the target surface may have two sides parallel in the first direction. The second substep may be performed such that the predetermined interference pattern areas do not overlap each other in a second direction but are present side by side in the second direction. The second direction is perpendicular to the first direction and generally parallel to the extending direction of the interference fringes.

Because there is no area which is not irradiated with the interference pattern in the second direction, it is possible to irradiate the substrate with the interference pattern that can form the structures side by side on the substrate even if the interference pattern areas do not overlap in the second direction. In this case, it is possible to reduce the number of shots (exposure processes) and improve the throughput. Because the interference pattern area is masked to a shape that has two sides parallel in the first direction, it is possible to irradiate the substrate with the interference pattern such that the structures spread over the target surface of the substrate, even if the interference pattern areas do not overlap in the second direction.

When the first and second substeps are repeated by predetermined times such that the predetermined interference pattern areas overlap each other in the stepwise manner in the first direction, the line-to-line pitch of interference fringes in one predetermined interference pattern ea may align with the line-to-line pitches of the interference fringes in subsequent predetermined interference pattern areas, and variations in an irradiance distribution integrated on the target surface of the substrate upon repeating the first and second substeps may become equal to or smaller than an allowable value. Thus, it is possible to suppress the variation in the irradiance distribution integrated on the target surface of the substrate in the allowable range. In this manner, the influences of those areas which are irradiated with the no interference pattern are reduced. Therefore, it is possible to irradiate the substrate with the interference pattern that can precisely form the structure on the substrate.

When the first and second substeps are repeated by predetermined times such that the predetermined interference pattern areas overlap each other in the stepwise manner in the first direction, the line-to-line pitch of interference fringes in one predetermined interference pattern area may align with the line-to-line pitches of the interference fringes in subsequent predetermined interference pattern areas, and variations in a line width of a fine pattern, which is formed on the substrate by the interference fringes upon repeating the first and second substeps, may become equal to or smaller than an allowable value. Thus, it is possible to suppress the variations in the line width of the fine pattern created on the substrate in an allowable range. The influences of those areas which are irradiated with the no interference pattern are reduced. Therefore, it is possible to irradiate the substrate with the interference pattern that can precisely form the structure on the substrate.

The method may further include determining an amount of each stepwise movement of the substrate when the substrate is conveyed in the stepwise manner in the second substep. The step of determining an amount of each stepwise movement may decide the amount of each stepwise movement from a plurality of candidate values for the amount of each stepwise movement based on results obtained when the target surface of the substrate is irradiated with the interference pattern while the substrate is being conveyed in the stepwise manner, using the candidate values for the amount of each stepwise movement. The amount of stepwise movement of the substrate in the second substep may be decided on the basis of the results obtained when the interference pattern areas are actually overlapped while changing the amount of stepwise movement of the substrate. In this case, no mechanism is needed to precisely measure the absolute value of the line-to-line pitch of the interference fringes, but it is still possible to arrange the interference pattern areas in the overlapping manner such that the line-to-line pitches of the interference fringes of the interference pattern areas match each other.

The step of masking the target surface may divide the target surface into a plurality of rectangular interference pattern areas. Then, it is possible to easily mask the interference pattern area, and precisely irradiate the substrate with the interference pattern without seams between the shots.

The predetermined interference pattern areas may be arranged in an overlapping manner over the entire target surface of the substrate without gaps. Then, it is possible to irradiate the substrate with the interference pattern that can form the structure that continuously extends on the large surface of the large substrate.

The predetei mined interference pattern areas may be discretely arranged over the target surface of the substrate. Then, it is possible to irradiate a large number of regions in the large substrate with the interference pattern.

The first substep may include irradiating each predetermined interference pattern area with a first shot of the interference pattern and further irradiating the same predetermined interference pattern area with a second shot of the interference pattern such that a longitudinal direction of the interference fringes of the first shot crosses a longitudinal direction of the interference fringes of the second shot at a predetermined angle. Because the same area is irradiated with the interference pattern a plurality of times, it is possible to irradiate the substrate with the interference pattern that can form the structure in the form of a dot pattern or a lattice pattern on the substrate.

The substrate may be turned by a predetermined angle after the first shot, and then the same predetermined interference pattern area may be irradiated with the second shot (and subsequent shots). Because the substrate is turned, it is possible to easily irradiate the substrate with the interference pattern a plurality of times.

According to another aspect of the present invention, there is provided a method of manufacturing a structure on a substrate. The structure has a fine pattern, and the fine pattern includes a plurality of concave portions and/or a plurality of concave portions. The fine pattern is formed on a surface of the substrate or a surface of a functional material layer. The functional material layer is formed on the substrate. The method includes forming a photosensitive material layer on the surface of the substrate or the surface of the functional material layer. The method also includes dividing a single beam emitted from a coherent light source into at least two branch beams. The method also includes causing these branch beams to cross each other at a predetermined interference angle thereby generating interference pattern, with longitudinal directions of interference fringes of the interference pattern crossing each other at a predetermined angle. The method also includes applying an exposure process to the photosensitive material layer with the interference pattern. The method also includes removing those areas of the photosensitive material layer which are irradiated with the interference pattern or removing those areas of the photosensitive material layer which are not irradiated with the interference pattern, after the exposure process with the interference pattern, thereby forming the fine pattern in the photosensitive material layer. The method also includes applying an etching process to the substrate or the functional material layer with the fine pattern of the photosensitive material layer, thereby creating a fine pattern on the surface of the substrate or the surface of the functional material layer. The step of applying an exposure process includes repeating a first substep of irradiating the substrate with the interference pattern, and a second substep of conveying the substrate to expose the photosensitive material layer. The method also includes dividing a surface of the photosensitive material layer into a plurality of predetermined interference pattern areas based on a region of the photosensitive material layer which is irradiated with a shot of the interference pattern. The first substep includes irradiating each of the predetermined interference pattern areas with every shot of the interference pattern. The second substep includes conveying the substrate in a stepwise manner such that the predetermined interference pattern areas overlap each other in the stepwise manner upon repeating the first substep and the second substep. The method also includes causing a line-to-line pitch of interference fringes in one of the predetermined interference pattern areas, made by one shot of the interference pattern, to align with the line-to-line pitch of the interference fringes in a next predetermined interference pattern area, made by a next shot of the interference pattern, upon repeating the first substep and the second substep.

The fine pattern is formed by the interference exposure (exposure using the interference pattern). The interference exposure can expose the fine pattern without using a fine photomask. No elements contact the substrate in the interference exposure. Therefore, as compared to the nanoimprint method, it is possible to improve the yield when manufacturing the products in a large volume. Unlike the nanoimprint method, the interference exposure does not require an expensive master mold. Thus, it is possible to provide the precise patterning at low cost. It is possible to easily and precisely manufacture the structure having a fine pattern on the surface of the substrate or the surface of the functional material layer. The fine pattern is periodic two dimensionally. The functional material layer is formed on the substrate. The fine pattern on the substrate or the functional material layer may be used an optical element, a semiconductor light-emitting element, or other devices.

Because small regions of the substrate are successively exposed while conveying the substrate in the stepwise manner, it is possible to expose a large substrate (large surface) without increasing the size of the exposure device. Thus, it is possible to reduce the cost which would otherwise be needed upon increasing the size of the exposure device. The two-beam interference exposure is carried out and the exposure area is masked to a desired shape. Thus, it is possible to avoid the use of the edge portions of the interference pattern in the overlapping exposure. The interference fringes are not parallel in the edge portions of the interference pattern. Therefore, it is possible to cause the interference pattern areas of the respective shots to partially overlap each other in an appropriate manner. It is possible to form a fine pattern that continuously extends on the large substrate having a large surface.

Prior to the step of applying an etching process, the method may further include applying a heat treatment to the fine pattern formed in the photosensitive material layer, thereby shaping the fine pattern to a desired fine pattern. Because the fine pattern is shaped by the heat treatment, it is possible to improve the accuracy (precision) of the resulting fine pattern. Also, the heat treatment can expand (increase) the width of the lines of the fine pattern and reduce the distance between each two adjacent convex portions. Thus, it is possible to form a structure that has a denser arrangement on the substrate. The structure has the convex portions arranged at a higher density on the substrate.

The photosensitive material layer may be made from a material having a glass-transition temperature, and the step of applying a heat treatment may include heating the fine pattern at a temperature higher than the glass-transition temperature. Because the heat treatment (heating) is carried out at the temperature higher than the glass-transition temperature, it is possible to utilize surface tension and naturally shape the fine pattern that has a shape containing anisotropy (e.g., oval shape) to a perfect circle. Then, the fine pattern formed on (in) the photosensitive material layer may be used as a mask in an etching process, and the etching process may be applied to the substrate or the functional material layer on the substrate to remove certain portions from the substrate or the functional material layer. After the etching process (i.e., the removing process), it is possible to provide a precise moth eye structure that has a bottom face of the perfect circle.

The step of applying the exposure process may include applying the exposure process to the photosensitive material layer a plurality of times, and a longitudinal direction of the interference fringes in a first exposure process may cross a longitudinal direction of the interference fringes in a second and subsequent exposure processes at a predetei mined angle. Because the interference exposure is performed a plurality of times, it is possible to easily form the fine pattern in the form of, for example, a dot pattern or a lattice pattern.

The step of applying the exposure process to the photosensitive material layer with the interference pattern may be carried out such that the step of removing the areas of the photosensitive material layer can form the fine pattern that has the convex portions and/or the concave portions in a square array. When the interference exposure is carried out with the longitudinal directions of the interference fringes crossing each other at 90 degrees, then it is possible to provide a moth eye structure in the square array.

The step of applying the exposure process to the photosensitive material layer with the interference pattern may be carried out such that the step of removing the areas of the photosensitive material layer can form the fine pattern that has the convex portions and/or the concave portions in a trigonal array. When the interference exposure is carried out with the longitudinal directions of the interference fringes crossing each other at 60 degrees, then it is possible to provide a moth eye structure in the trigonal array. As compared to the moth eye structure in the square array, the moth eye structure in the trigonal array is denser. The moth eye structure in the trigonal array has more convex portions than the moth eye structure in the square array.

The step of applying the exposure process with the interference pattern may include applying a first exposure process and at least one subsequent exposure process, and the method may further include turning the substrate by a predetermined angle after the step of applying the first exposure process to the photosensitive material layer with the interference pattern, and then applying the second exposure process (and subsequent exposure processes) with the interference pattern. Because the substrate is turned, it is possible to easily perforin the exposure process a plurality of times.

According to still another aspect of the present invention, there is provided a method of manufacturing a structure on a substrate. The structure has a fine pattern, and the fine pattern includes a plurality of concave portions and/or a plurality of concave portions. The fine pattern is formed on a surface of the substrate or a surface of a functional material layer. The functional material layer is formed on the substrate. The method includes dividing a single beam emitted from a coherent light source into at least two branch beams. The method also includes causing these branch beams to cross each other at a predetermined interference angle thereby generating interference pattern, with longitudinal directions of interference fringes of the interference pattern crossing each other at a predetermined angle. The method also includes applying an exposure process to the substrate or the photosensitive material layer with the interference pattern, thereby removing some portions from the substrate or the photosensitive material layer to form the fine pattern. The step of applying an exposure process includes repeating a first substep of irradiating the substrate with the interference pattern, and a second substep of conveying the substrate to expose the substrate or the photosensitive material layer. The method also includes dividing a surface of the substrate or the photosensitive material layer into a plurality of predetermined interference pattern areas based on a region of the substrate or the photosensitive material layer which is irradiated with a shot of the interference pattern. The first substep includes irradiating each of the predetermined interference pattern areas with every shot of the interference pattern. The second substep includes conveying the substrate in a stepwise manner such that the predetermined interference pattern areas overlap each other in the stepwise manner upon repeating the first substep and the second substep. The method also includes causing a line-to-line pitch of interference fringes in one of the predetermined interference pattern areas, made by one shot of the interference pattern, to align with the line-to-line pitch of the interference fringes in a next predetermined interference pattern area, made by a next shot of the interference pattern, upon repeating the first substep and the second substep.

The fine pattern is formed by the interference exposure (exposure using the interference pattern). Therefore, as compared to the nanoimprint method, it is possible to improve the yield when manufacturing the products in a large volume. It is also possible to provide the precise patterning at low cost. Therefore, it is possible to easily and precisely manufacture the structure having a fine pattern on the surface of the substrate or the surface of the functional material layer. The fine pattern is periodic two dimensionally. The functional material layer is formed on the substrate.

Because small regions of the substrate are successively exposed while conveying the substrate in the stepwise manner, it is possible to expose a large substrate (large surface) without increasing the size of the exposure device. Thus, it is possible to reduce the cost which would otherwise be needed upon increasing the size of the exposure device. The two-beam interference exposure is carried out and the exposure area is masked to a desired shape. Thus, it is possible to avoid the use of the edge portions of the interference pattern in the overlapping exposure. The interference fringes are not parallel in the edge portions of the interference pattern. Therefore, it is possible to cause the interference pattern areas of the respective shots to partially overlap each other in an appropriate manner. It is possible to form a fine pattern that continuously extends on the large substrate having a large surface.

According to yet another aspect of the present invention, there is provided a method of manufacturing a structure on a substrate. The structure has periodic features on a surface of the substrate or a surface of a functional material layer. The functional material layer is formed on the substrate. The method includes dividing a single beam emitted from a coherent light source into at least two branch beams. The method also includes causing these branch beams to cross each other at a predetermined interference angle thereby generating interference pattern, with longitudinal directions of interference fringes of the interference pattern crossing each other at a predetermined angle. The method also includes applying an exposure process to the substrate or the photosensitive material layer with the interference pattern, thereby imparting a physical property to the substrate or the photosensitive material layer based on the interference fringes of the interference pattern. The step of applying an exposure process includes repeating a first substep of irradiating the substrate with the interference pattern, and a second substep of conveying the substrate to expose the substrate or the photosensitive material layer. The method also includes dividing a surface of the substrate or the photosensitive material layer into a plurality of predetermined interference pattern areas based on a region of the substrate or the photosensitive material layer which is irradiated with a shot of the interference pattern. The first substep includes irradiating each of the predetermined interference pattern areas with every shot of the interference pattern. The second substep includes conveying the substrate in a stepwise manner such that the predetermined interference pattern areas overlap each other in the stepwise manner upon repeating the first substep and the second substep. The method also includes causing a line-to-line pitch of interference fringes in one of the predetermined interference pattern areas, made by one shot of the interference pattern, to align with the line-to-line pitch of the interference fringes in a next predetermined interference pattern area, made by a next shot of the interference pattern, upon repeating the first substep and the second substep. This method can form a fine and periodic structure that continuously extends on the substrate having a large surface.

According to another aspect of the present invention, there is provided a structure on a substrate, which is manufactured by a method according to any one of the above-described aspects of the present invention. Thus, the structure on the substrate can have a precise and fine pattern on the substrate.

According to another aspect of the present invention, there is provided an exposure device that includes a light source configured to emit a coherent beam. The exposure device also includes an optical system configured to divide the coherent beam, emitted from the light source, into at least two branch beams and cause these branch beams to cross each other at a predetermined interference angle thereby generating interference pattern, with longitudinal directions of interference fringes of the interference pattern crossing each other at a predetermined angle. The exposure device also includes a light blocking member disposed on or above the substrate. The light blocking member has a light transmitting portion. The light transmitting portion has a predetermined shape and is configured to allow the interference pattern to pass therethrough such that the interference pattern is masked when the interference pattern passes through the light transmitting portion. The exposure device also includes a substrate conveyance controller configured to repeat irradiating the substrate with the interference pattern that has passed through the light transmitting portion of the light blocking member, and conveying the substrate in a stepwise manner to expose the substrate with the masked interference pattern in the stepwise manner. The substrate conveyance controller is configured to convey the substrate in the stepwise manner such that the masked interference pattern overlaps each other in a stepwise manner upon repeating irradiating the substrate with the interference pattern and conveying the substrate in the stepwise manner, and such that a line-to-line pitch of interference fringes on the substrate, which is made by one shot of the masked interference pattern, aligns with the line-to-line pitch of the interference fringes, which is made by a next shot of the masked interference pattern upon repeating irradiating the substrate with the interference pattern and conveying the substrate in the stepwise manner.

Because small regions of the substrate are successively irradiated with the light while the substrate being conveyed in the stepwise manner, it is possible to irradiate a large substrate with the light without increasing the size of the exposure device. Thus, a cost increase which would otherwise be needed by the size increase of the exposure device is avoided. When the two-beam interference exposure is carried out, the areas of the substrate irradiated with the interference pattern are masked to the predetermined shapes. Thus, the edge portions of the interference pattern are not used in the overlapping exposure. The edge portions of the interference pattern do not have parallel interference fringes. Accordingly, it is possible to cause the interference pattern areas of the respective shots to partially overlap each other in a desired manner. Therefore, it is possible to expose a fine structure that continuously extends on a large surface of the large substrate.

According to the present invention, small regions of the substrate are successively irradiated with the light while the substrate being conveyed in the stepwise manner. Thus, it is possible to irradiate a fine pattern on a large substrate with the light without increasing the size of the exposure device. Because the interference pattern area, which is irradiated with each shot, is masked to a predetermined shape, it is possible to prevent the substrate from being irradiated with the edge portions of the interference pattern. The edge portions of the interference pattern do not have parallel interference fringes. Accordingly, it is possible to cause the interference pattern areas of the respective shots to partially overlap each other in a desired manner. Therefore, it is possible to irradiate the substrate with the light that can expose a fine pattern on a large surface of the large substrate.

These and other objects, aspects and advantages of the present invention will become apparent to those skilled in the art from the following detailed description when read and understood in conjunction with the appended claims and drawings.

BRIEF DESCRIPTION OF THE DRAWINGS

FIGS. 4A to 4C are views useful to describe an overlapping exposure.

FIG. 11A a schematic structure of an exposure device used to carry out another conventional exposure method.

FIG. 11B illustrates an effective area of the exposure pattern.

FIG. 11C illustrates the irradiance distribution in the X-direction.

FIG. 11D illustrates the irradiance distribution in the Y-direction.

DETAILED DESCRIPTION OF EMBODIMENTS

Embodiments of the present invention will now be described with reference to the accompanying drawings.

First Embodiment

Figure 1:
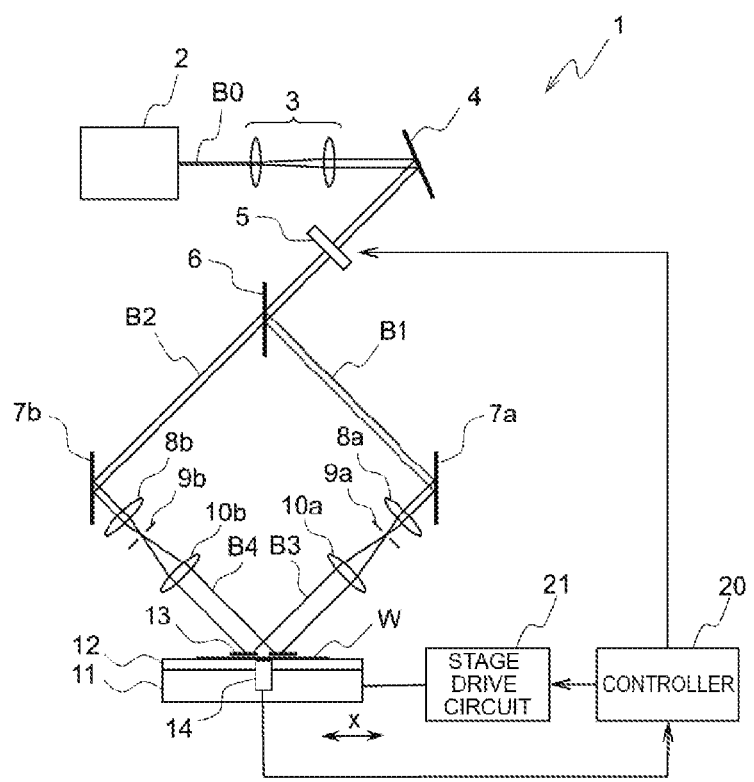
FIG. 1 shows a schematic configuration of an exposure device according to a first embodiment of the present invention.

Referring to FIG. 1, an exposure device 1 of this embodiment will be described. The exposure device 1 includes a light source 2, a beam expander 3, a bring-down mirror 4, a shutter 5, a beam splitting element 6, turn-around mirrors 7a and 7b, light condensing lenses 8a and 8b, pin hole elements 9a and 9b, and collimator lenses 10a and 10b. The exposure device 1 also includes a stage 11, a suction table 12, a mask 13, a gap sensor 14, a controller 20, and a stage drive circuit 21.

The light source 2 is a coherent light source that emits coherent light. For example, the light source 2 is a diode-pumped (LD-pumped) solid-state laser that emits a laser beam at a predetermined wavelength λ. The predetermined wavelength λ is, for example, 266 nm. The laser beam B0 emitted from the light source 2 is expanded by the beam expander 3, and the laser beam has an enlarged beam diameter. Then, the optical path of the laser beam is reflected by the bring-down mirror 4. The shutter 5 is configured to block passage of the laser beam therethrough when the shutter 5 is in an ON condition, and allow the laser beam to pass therethrough when the shutter 5 is in an OFF condition. The shutter 5 is disposed between the mirror 4 and the beam splitting element 6. Opening and closing (i.e., OFF and ON) of the shutter 5 is controlled by the controller 20.

The beam splitting element 6 is configured to split a single laser beam B0 into two laser beams B1 and B2. The beam splitting element 6 is a concave-convex diffraction element that has a fine concave-convex shape in its surface, which is made from, for example, quartz. The diffraction takes place by taking advantage of the fine concave-convex shape. The two laser beams B1 and B2, which are produced by the beam splitting element 6, are reflected by the turn-around mirrors 7a and 7b, and are incident to the light condensing lenses 8a and 8b respectively. The two laser beams B1 and B2 may be referred to as "branch beams." After the light condensing at the light condensing lens 8a, the laser beam is incident to the pin hole 9a such that the laser beam has an enlarged beam diameter. Then, the laser beam is collimated by the collimator lens 10a. In this manner, the laser beam B3 is obtained. Likewise, after the light condensing at the light condensing lens 8b, the laser beam is incident to the pin hole 9b such that the laser beam has an enlarged beam diameter. Then, the laser beam is collimated by the collimator lens 10b. In this manner, the laser beam B4 is obtained. The pin holes 9a and 9b serve as the spatial filters. The pin holes 9a and 9b are used to remove (eliminate) irregularities or disturbances in the beam wave front, which are generated when the beams travel from the light source 2 to the light condensing lenses 8a and 8b. The collimating lenses 10a and 10b are used to allow the laser beams to have an ideal flat wave front. Thus, the laser beams B3 and B4 become plane waves. The laser beams B3 and B4 are parallel beams.

Figure 2:
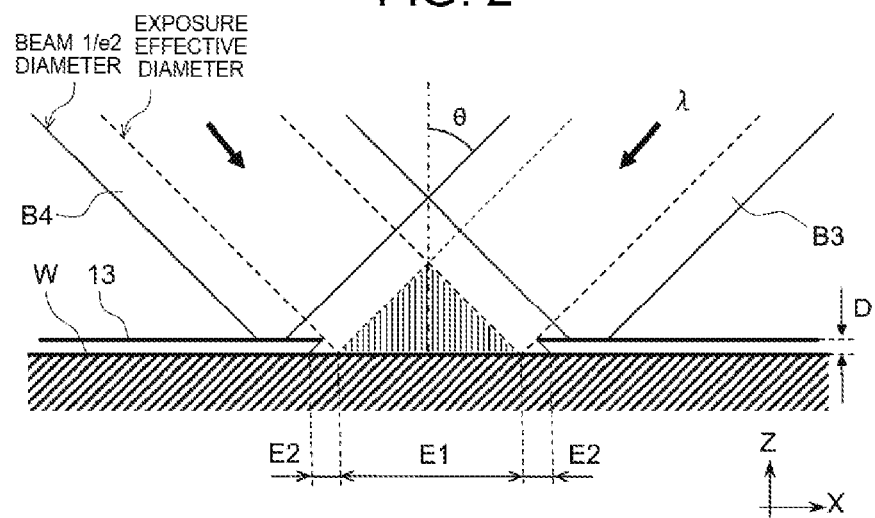
FIG. 2 shows how an effective irradiation area is formed.

As shown in FIG. 2, the two laser beams B3 and B4 cross each other at a predetermined interference angle 2θ (2 theta). Thus, the two laser beams B3 and B4 create, in combination, interference fringes on the workpiece (substrate) W because the two laser beams B3 and B4 interfere with each other. In other words, the two laser beams B3 and B4 creates an interference beam on the work W. The exposure device 1 utilizes the interference beam as the exposure beam to be applied to the target area of the work W in an exposure process. As such, the exposure device 1 transfers, by one exposure, stripe-shaped interference fringes (line-and-spacing interference fringes) on the work W.

Therefore, the optical system that includes the beam expander 3, the bring-down mirror 4, the shutter 5, the beam splitting element 6, the turn-around mirrors 7a and 7b, the light condensing lenses 8a and 8b, the pin holes 9a and 9b and the collimating lenses 10a and 10b splits the beam emitted from the light source 2 into the two beams, and causes the two beams to cross each other at the interference angle 2θ such that the interference beam is generated. The optical system has a pair of reflection mirrors 7a and 7b, a pair of condensing lenses 8a and 8b, a pair of pin holes 9a and 9b, and a pair of collimating lenses 10a and 10b between the beam splitting element 6 and the work W. This configuration guides the two laser beams, which are produced by the beam splitting element 6, such that the two laser beams reach the work W respectively, and interference with each other on the work W.

Referring back to FIG. 1, the work W may be secured on the suction table 12 disposed on the stage 11. The work W is, for example, a substrate on which a photosensitive material layer (e.g., photoresist layer) is formed. Alternatively, the work W may be a substrate that has a functional material layer on an upper surface of the substrate, and a photosensitive material layer on an upper surface of the functional material layer. The substrate used in this embodiment may be a fluorescent substrate that contains a fluorescent material or substance which is excited by an excitation beam. Alternatively, the work W may be a glass substrate, or a substrate that has an organic mono-molecular film (organic monolayer), such as an SAM film (self-assembled mono-molecular film), on the surface of the substrate. As the target area of such work W is irradiated with the interference beam(s), a fine pattern, which has a plurality of concaves and/or convexes arranged in a desired manner, may be created on the surface of the substrate or on the surface of the functional material layer formed on the substrate, or the surface reforming (surface modification) may be performed to the substrate.

If the photosensitive material layer (resist) applied on the substrate is a positive resist, those portions of the resist which are irradiated with the interference beam dissolve in the developing liquid. When the positive resist is used, and the resist is exposed and developed by the interference beam, then those portions of the resist which are not irradiated with the interference beam remain in the resist pattern. On the other hand, if the resist is a negative resist, those portions of the resist which are irradiated with the interference beam cross-link and do not dissolve in the developing liquid. When the negative resist is used, and the resist is exposed and developed by the interference beam, then the resulting resist pattern has the irradiated portions remaining after the development.

The stage 11 can move in the X-direction and Y-direction in parallel to the surface of the work W. The X-direction is the right-left direction in FIG. 1. The Y-direction is a direction perpendicular to the drawing sheet of FIG. 1. The controller 20 controls the stage drive circuit 21 to move the stage 11 in the X-direction and/or the Y-direction. Thus, the work W can move in the X-direction and the Y-direction upon movements of the stage 11 in the X-direction and the Y-direction.

In this embodiment, the aberrations of the lenses are considered, and the light beams which are taken from the center areas of the collimator lenses 10a and 10b are only used for the exposure to the workpiece W. Specifically, a mask 13 having an opening is disposed on (or above) the workpiece W, and the center portions of the light beams that have passed through the collimator lenses 10a and 10b are only allowed to pass through the mask 13 and reach the workpiece W as the exposure light. The opening of the mask 13 is a light transmitting portion. The light beams that pass through the mask 13 form the interference pattern and serves as the exposure light, and the workpiece W is irradiated with such exposure light.

The mask 13 is a light blocking member that has a light transmitting portion having a predetermined shape. For example, the mask 13 is a metallic plate that has an opening having a predetermined shape. The opening is formed at an approximate center area of the metallic plate. Alternatively, the mask 13 may be a transparent plate such as a glass plate, with a light blocking film being formed on the transparent plate. The light blocking film has a light transmitting portion (opening) that exposes a certain part of the transparent plate. The light blocking film may be made from chrome.

The shape of the light transmitting portion may have any suitable shape. For example, the shape of the light transmitting portion is rectangular. As the mask 13 having the above-described structure and characteristic is placed above the workpiece W, the area of the workpiece W which is irradiated with the interference pattern by one shot is made to the shape of the opening of the mask 13 when the two light beams are incident to the mask 13 at the interference angle 2θ. In the following description, the area of the workpiece W which is defined by the opening of the mask 13 and is irradiated with the interference pattern is referred to as "effective irradiation area."

The opening of the mask 13 is smaller than the area of the workpiece W which is irradiated with the light that has passed through the collimator lenses 10a and 10b. It should be noted that a preferred or most preferred size of the opening of the mask 13 depends on the exposure conditions. For example, the wavelength λ is 266 nm, the interference angle θ is 47.6 degrees (2θ is 95.2 degrees), the pitch of the interference fringes (line-and-spacing pitch or L&S pitch) is 180 nm, the diameter of the area irradiated with the light ($1/e^2$ diameter of the light) is 82 mm, the contrast of the interference fringes is 70%, the laser output is 100 mW, the photosensitive threshold of the resist is 5 mJ/cm$^2$, and the workpiece is a 8-inch wafer, and 90% of the area is the exposure area. If the target width (L) of each line of the interference fringes is 60±10 nm, then the size of the rectangular opening of the mask 13 is preferably from 8 mm×5 mm to 36 mm×24 mm. In particular, when the target width (L) of each line of the interference fringes is 60±5 nm, and the tact time is 10 minutes/one wafer, then the size of the rectangular opening of the mask 13 is preferably from 18 mm×12 mm to 24 mm×16 mm.

The beam diameter ($1/e^2$ diameter) of each of the laser beams B3 and B4 may be appropriately decided (altered) by the magnifications of the beam expander 3, the condenser lenses 8a and 8b, and/or the collimator lenses 10a and 10b. Thus, the size of the mask 13 may be changed depending upon the size of the beam diameter and/or the use of the exposure device 1.

As illustrated in FIG. 2, the mask 13 is disposed above the workpiece W, with a certain gap D being left between the workpiece W and the mask 13. As shown in FIG. 1, the gap sensor 14 is embedded in the stage 11 and the suction table 12. The gap sensor 14 can measure the distance (gap) between the mask 13 and the suction table 12.

The mask 13 is supported by a holder that can adjust the distance between the mask 13 and the suction table 12. Before the exposure process is applied to the workpiece W, the distance between the suction table 12 and the mask 13 is adjusted such that a desired gap D is left depending upon the thickness of the workpiece W fixed on the suction table 12.

As shown in FIG. 2, because the mask 13 is disposed above the workpiece W with the gap D, there are created, on the workpiece W, an area that is irradiated with the interference pattern of the laser beams B3 and B4, and another area that is irradiated with one of the laser beams B3 and B4. Thus, the effective irradiation area includes the interference pattern irradiation area E1, which is irradiated with the interference pattern, and the no interference pattern irradiation areas E2, which are formed on both sides of the interference pattern irradiation area E1 when viewed in the X-direction. The no interference pattern irradiation areas E2 are formed by the geometric sneaking of the light beams. The interference pattern irradiation area E1 may be referred to as "interference area" and the no interference pattern irradiation area E2 may be referred to as "no interference area." The width E2w of the no interference area E2 depends upon the gap D and the interference angle θ, and is given by 2D·tan θ.

Figure 3:
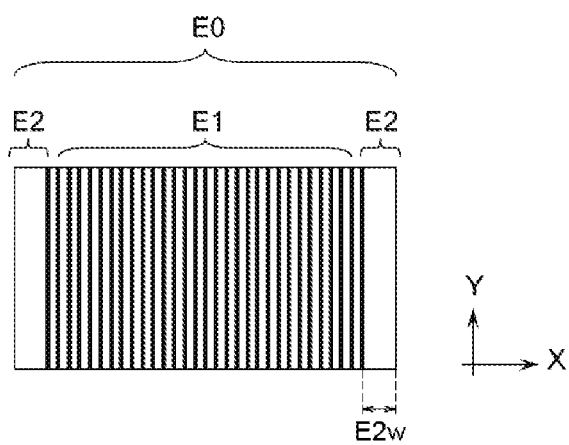
FIG. 3 shows an exemplary effective irradiation area that includes an interference pattern irradiation area and no interference pattern irradiation areas.

FIG. 3 is a plan view of the effective irradiation area E0 on the workpiece W when the effective irradiation area E0 has a rectangular shape. The right-and-left direction of FIG. 3 is the X-direction, and the up-and-down direction of FIG. 3 is the Y-direction. As depicted in FIG. 3, the interference area E1 is formed at the center area of the effective irradiation area E0, and the no interference areas E2 are formed on both sides of the interference area E1 when viewed in the X-direction. The interference fringes are formed in the interference area E1, and the interference fringes are not formed in the no interference areas E2.

For example, when the wavelength λ of the light from the light source 2 is 266 nm, and the interference angle θ is between 15 degrees and 60 degrees (15°≤θ≤60°), then the interference fringes having a stripe shape (line-and-spacing shape) are formed, with the line-to-line pitch being 154 nm to 514 nm, in the interference area E1 of FIG. 3. The line-to-line pitch of the interference fringes depends upon the interference angle θ, the wavelength λ of the laser beam emitted from the light source 2, and the refractive index n of the exposure environment, and is given by $\lambda/(2n \sin \theta)$. Thus, the line-to-line pitch of the interference fringes may be reduced to a value close to a half of the wavelength λ of the laser beam emitted from the light source 2, if the refractive index n of the exposure environment is equal to one (i.e., if the exposure is carried out in the air).

In this embodiment, an "overlapping exposure" is performed to expose the entire workpiece W. An exposure area of the substrate is divided into small regions such that these small regions overlap at least in a certain direction. In the overlapping exposure, an exposure process is carried out repeatedly while the substrate is being moved. The respective small regions are successively exposed by such repletion of the exposure process or the "overlapping exposure."

When the overlapping exposure is employed to expose the substrate, the controller 20 controls the stepwise actuation of the stage 11 and the opening/closing of the shutter 5. Specifically, the controller 20 causes the stage 11, on which the workpiece W is mounted, to move to a predetermined position. Then, the controller 20 causes the shutter 5 to open, thereby performing the exposure (first exposure or first step exposure) to the first small area. After the first exposure, the controller 20 causes the shutter 5 to close, thereby finishing the first exposure. Subsequently, the controller 20 causes the stage 11 to move by a predetermined distance for a next exposure to the second small area. This series of actions (exposure) and movements are repeated until the entire exposure area, which is decided beforehand, is exposed. The controller 20 serves as a control unit to move the substrate.

Referring to FIG. 4A to FIG. 4C, the overlapping exposure will be described in detail. In this embodiment, the effective irradiation area E0 is moved over the workpiece W by the predetermined distance P in the X-direction upon each exposure process during the overlapping exposure. For example, in FIG. 4A, the effective irradiation area E0 is moved to the right by the predetermined distance P after the first exposure ("first shot" in FIG. 4A). This movement is carried out such that the interference area E1 of the first exposure (first shot) partly overlaps the interference area E1 of the second exposure (second shot). The predetermined distance P is an amount of movement of the stage 11 between two shots. The distance P is decided such that the line-to-line pitch of the interference fringes of the current shot overlap the line-to-line pitch of the interference fringes of a preceding shot after the movement by the distance P. One shot of interference fringes does not create a flat irradiance distribution, as shown in FIG. 4B. Specifically, the irradiance of the interference infringes is high in the center portion of the interference area E1, and the irradiance decreases toward the ends (edges) of the interference area E1 when viewed in the X-direction. In the no interference areas E2, no interference fringes are created. In this embodiment, however, the overlapping exposure is carried out. In the overlapping exposure, the exposure process is carried out a plurality of times in an overlapping manner while the interference area E1 is being successively (in a stepwise manner) moved in the X-direction. As a result, as shown in FIG. 4C, the irradiance distribution of the interference fringes is able to have a generally flat distribution in the X-direction when a plurality of (or a series of) exposure processes are finished. The envelope curve is almost flat in FIG. 4C.

The exposure time of each shot (each exposure process) of the overlapping exposure is shorter than the exposure time of an all-at-once exposure. The shots of the overlapping exposure are shifted a plurality of times that is decided by the (short) exposure time of each shot. In the overlapping exposure, an area which is once irradiated with the no interference pattern will be irradiated with the interference pattern in a next or subsequent shot. Therefore, the exposure energy to be applied to the area by one shot may be reduced depending upon how many the exposure process is carried out to the same area in the overlapping manner (i.e., depending upon the number of the exposure process carried out in the overlapping manner). When the number of the exposure process carried out in the overlapping manner reaches a certain value, the influences of the irradiation with the no interference pattern become almost neglectable. For example, if the interference area E1 is overlapped m times in FIG. 4A during the overlapping exposure, the influences of the no interference areas E2 can be reduced to 1/m. The manner of deciding the conditions of the overlapping exposure, such as an amount of the shifting movement P of the stage 11 and the number of the overlapping m of the interference area E1, will be described later.

Figure 5:
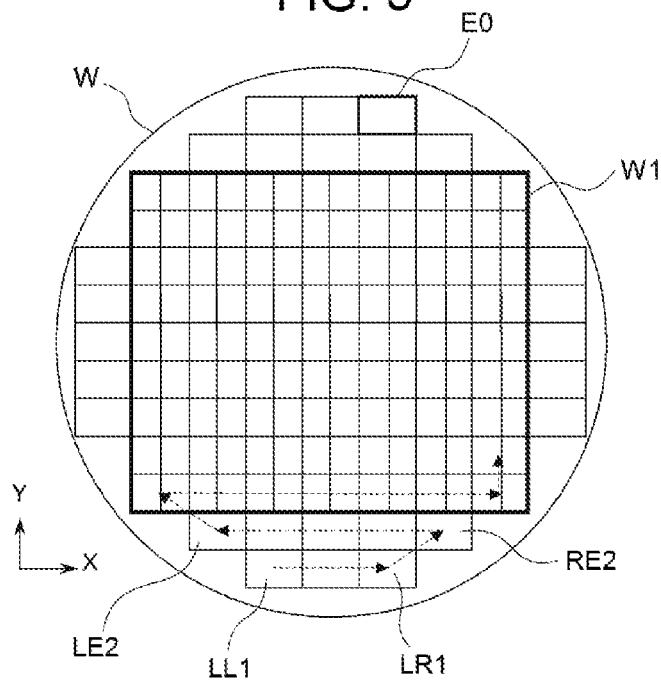
FIG. 5 illustrates an exemplary and schematic layout of exposure shots made by the overlapping exposure.

In the overlapping exposure, the exposure process starts from, for example, the lower left position LL1 of the workpiece W, as shown in FIG. 5. Firstly, the workpiece W is conveyed in the −X-direction (to the left in FIG. 5) such that the effective irradiation area E0 is shifted relative to the workpiece W to expose the first (lowest) row of the workpiece W. In other words, the exposure area moves successively from the lower left position LL1 of the workpiece W in the +X-direction (to the right in FIG. 5) until the exposure area arrives at the lower right position LR1 of the workpiece W. Thus, the first row of the workpiece W is exposed. Then, the workpiece W is conveyed in the −Y-direction (downward direction in FIG. 5) such that the effective irradiation area E0 is shifted to the right end RE2 of the second row. The workpiece W is conveyed in the +X-direction (to the right in FIG. 5) such that the effective irradiation area E0 is moved relative to the workpiece W to expose the second row of the workpiece W. In other words, the exposure process to the second row is performed as the exposure area moves successively from the right end position RE2 of the workpiece W in the −X-direction (to the left in FIG. 5) until the exposure area arrives at the left end position LE2 of the workpiece W. These movements are indicated by the broken line arrows in FIG. 5 that starts from the lower left position LL1 of the workpiece W.

When the exposure area moves in each row of the workpiece W in the X-direction, the overlapping exposure is carried out such that the line-to-line pitch of the interference fringes in the interference area E1 of one exposure process (one shot) overlaps the line-to-line pitch of the interference fringes in the interference area E1 of a next exposure process (next shot). In the Y-direction, the interference area E1 of the first row does not overlap the interference area E1 of the second row, but, the interference area E1 of the first row is present next to the interference area E1 of the second row. It should be noted that the overlapping exposure may only be carried out to the zone W1 in FIG. 5, and a step-and-repeat exposure may be applied to other areas of the workpiece W. The zone W1 indicates an area of the workpiece W which is used ultimately as the final product(s). In the step-and-repeat exposure, the exposure process is not performed in an overlapping manner. In other words, the interference areas E1 of the two exposure processes overlap each other in the workpiece conveying direction when the zone W1 is exposed whereas the interference areas E1 of the two exposure processes do not overlap each other in the workpiece conveying direction but are formed next to each other when the areas other than the zone W1 are exposed.

The above-described operations (exposure and movements) are repeated from the lower end of the workpiece W to the upper end of the workpiece W in the Y-direction to expose the entire workpiece W. Consequently, it is possible to irradiate the entire surface of the workpiece W with the exposure light in a seamless manner (without seams between the shots). As such, the entire workpiece W is exposed at high precision.

The manner of deciding the conditions of the overlapping exposure will now be described.

Firstly, a manner of deciding the number of overlapping m will be described.

Figure 6:
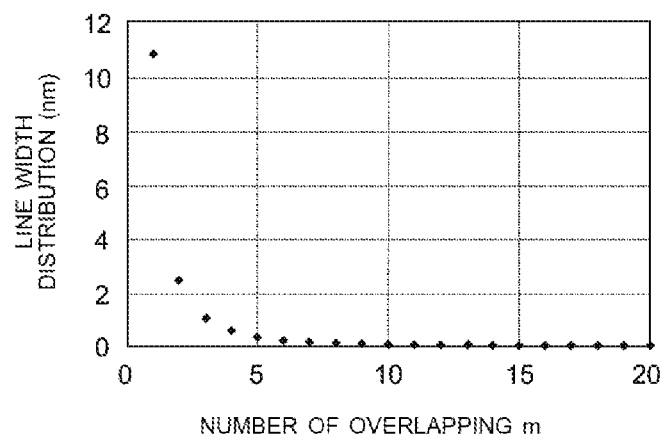
FIG. 6 is a graph showing relation between the number of overlapping and the line width distribution.

If single shot exposure, which does not carry out the exposure in an overlapping manner, is performed, a distribution of a Gaussian beam is simply (directly) transferred to the workpiece W. Thus, if the photosensitive material layer of the workpiece W is a resist layer, the width of each line of the stripe (line-and-spacing shape) is the smallest at the center of the workpiece and, gradually increases toward the edges of the workpiece. On the contrary, when the overlapping exposure is performed, the intensity distribution on the workpiece becomes gentle when viewed in the overlapping direction, and therefore the irregularities in the line width distribution become small (the line width distribution approaches a flat distribution). The irregularities in the line width distribution become smaller as the number of overlapping m increases. One example of the relation between the number of overlapping m and the line width distribution is shown in FIG. 6. In this graph, the line width distribution is a distribution of values of the line width along the overlapping direction (X-axis direction), with the center of each shot being an origin. As understood from FIG. 6, the line width distribution changes with the number of overlapping m. Thus, the number of overlapping m may be decided such that the line width distribution stays in an allowable range.

If the single shot exposure is performed, the pattern is not discontinuous in the no interference areas E2. On the other hand, when the overlapping exposure is performed, an amount of exposure is a sum of the interference intensity distribution (fringes) and a flat intensity distribution (offset) in the exposure area including the no interference areas E2. This exposure area includes any area as long as the area is irradiated with the no interference pattern at least one time.

Thus, the contrast ratio in the exposure area, including the no interference areas E2, changes every time the exposure area is irradiated with the interference pattern during the overlapping exposure. Therefore, the pattern gradually becomes discontinuous. The contrast ratio is given by the following equation.

$$V = (I\max - I\min)/(I\max + I\min)$$

where Imax is the maximum value of the light intensity, and Imin is the minimum value of the light intensity.

Figure 7A:
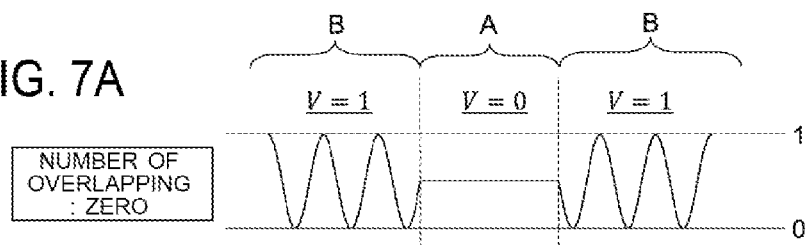
FIG. 7A shows relation between the number of overlapping and the contrast ratio when the number of overlapping is zero.
Figure 7B:
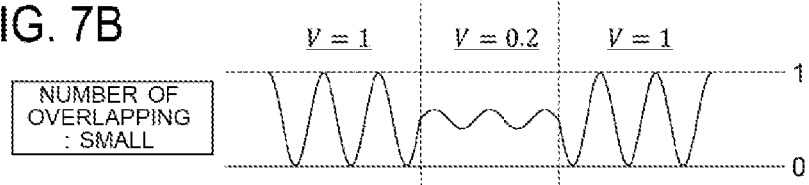
FIG. 7B shows the relation between the number of overlapping and the contrast ratio when the number of overlapping is small.
Figure 7C:
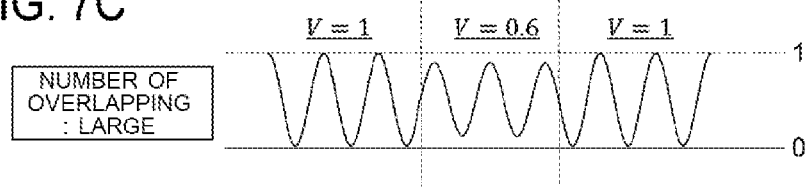
FIG. 7C shows the relation between the number of overlapping and the contrast ratio when the number of overlapping is large.

As depicted in FIG. 7A to FIG. 7C, the difference (fluctuation) between the contrast ratio V in the exposure area A that includes the no interference areas E2 and the contrast ratio V in the exposure area B that does not include the no interference areas E2 decreases as the number of overlapping m increases. Thus, it is possible to reduce the influences of the no interference areas E2 by increasing the number of overlapping. As such, the number of overlapping m may be set to a value such that the difference between the contrast ratio V in the exposure area A and the contrast ratio V in the exposure area B is equal to or smaller than an allowable value (i.e., the difference falls in an allowable range). Specifically, the number of overlapping m may be set to a value such that the difference between the contrast ratio V in the exposure area A and the contrast ratio V in the exposure area B becomes 50% or less, and preferably 10% or less.

As mentioned above, the influences of the no interference areas E2 are reduced as the number of overlapping m increases. Then, the difference (fluctuation) in the contrast ratio between the exposure areas A and B is reduced as the influences of the no interference areas E2 are reduced. As a consequence, the line width variations in the fine pattern produced on the photosensitive material layer (i.e., the decrease in the line width) become small(er) in the exposure area A relative to the exposure areas B. The decrease in the line width may be calculated if the exposure light intensity distribution and the contrast distribution are given in connection with the photosensitive threshold value of the photosensitive material layer. It is possible to know (or obtain) the exposure light intensity distribution from the design details of the optical system and measurements. It can be assumed that the contrast distribution is generally flat, and therefore it is possible to know the contrast distribution from experiments.

Figure 8:
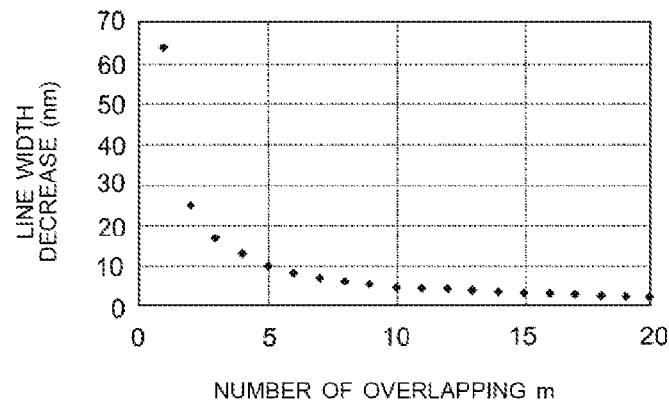
FIG. 8 is a graph showing relation between the number of overlapping and the decrease in the line width.

Specifically, it is possible to indirectly know the contrast distribution by actually performing the exposure and measuring the line width discrepancy from when the contrast ratio V is assumed to be one. FIG. 8 shows an example of the relation between the number of overlapping m and the decrease in the line width in the exposure area including the no interference areas E2. As shown in FIG. 8, when the number of overlapping m is five, then the line width decrease can be reduced to approximately 10 nm. When the number of overlapping m is ten, then the line width decrease can be reduced to approximately 5 nm. Thus, the number of overlapping m may be set to a value that causes the line width decrease to be an allowable value (or to fall in an allowable range).

As described above, the number of overlapping m may be set to a value such that each of the difference in the contrast ratio V and the difference (fluctuation) in the line width of the fine pattern between the exposure area including the no interference areas E2 and the exposure area not including the no interference areas E2 becomes a value equal to or smaller than the allowable value. In this manner, the number of overlapping m may be set to a value that reduces the influences of the no interference areas E2 to an allowable level. For example, the inventor confirmed that desired patterning was obtained when the number of overlapping m of the overlapping exposure was ten.

It should be noted that the exposure time T of each shot (each exposure process) of the overlapping exposure may be decided on the basis of the number of overlapping m. Specifically, the exposure time T of each shot may be given the following equation.

$$T = \text{weighting} \times (1/m)$$

Next, the manner of deciding the amount of movement P of the stage 11 between each two shots will be described.

In this embodiment, as described above, the stage 11 is moved such that the line-to-line pitch of the interference fringes of one shot (e.g., first shot) overlaps the line-to-line pitch of the interference fringes of a next shot (e.g., second shot) when the interference areas E1 of the two consecutive shots (e.g., the first and second shots) overlap each other.

It should be noted that all of the line-to-line pitches of the interference fringes are not always equal to the preset pitch (target pitch). In reality, the line-to-line pitches of the interference fringes may have slight errors (discrepancy) from the target pitch. When the stage 11 is moved during the overlapping exposure, the small error of the line-to-line pitch of one shot may be accumulated onto the next small error of the line-to-line pitch of a next shot, and such accumulation of the errors continue. As a result, the phase of the interference fringes may be inverted, and the inverted interference fringes overlap the interference fringes of the preceding shot(s). Then, the interference fringes of the shots may counterbalance (weaken) each other. For example, when the target pitch is 200 nm and each line-to-line pitch has an error of 1 pm, then the accumulated error becomes 100 nm after moving the stage by 20 mm. Thus, the phase of the interference fringes is opposite the phase of the target pitch, and the overlapped patterns counterbalance (cancel) each other. Accordingly, the patterns do not become discontinuous (distinctive).

One way of deciding the amount of movement P includes measuring absolute values of the line-to-line pitches of the interference fringes, and deciding the amount of movement P on the measured absolute values. However, it is not easy to accurately measure the absolute values of the line-to-line pitches of the interference fringes because such measurement requires a very high resolution (e.g., in the order of pm or finer).

In this embodiment, therefore, a different approach is used. Specifically, the accumulated error itself is measured (obtained) in an indirect manner. In order to indirectly obtain the accumulated error, a pre-treatment is carried out. The pre-treatment includes the overlapping exposure which will be described below. Firstly, the number of overlapping m is set to a certain value (e.g., from two to five), and a plurality of candidate values (e.g., ten candidate values) for the amount of movement P of the overlapping exposure are prepared. With these candidate values for the amount of movement P, the overlapping exposure is carried out a plurality of times (e.g., ten times when there are ten candidate values). The resulting exposure patterns are then observed. For example, the candidate values for the amount of movement P are ten different values, with the difference between each two candidate values being 10% of the target pitch. Thus, the ten candidate values are given by the following equation.

Candidate value=predetermined amount of movement for the overlapping exposure+the line-to-line pitch of the interference fringes×0.1×k
($k$=0,1,2, . . . , 9)

As a result of the overlapping exposure, the pattern remains if the phases of the line-to-line pitches of the interference fringes match each other, and the pattern is destroyed if the phases of the line-to-line pitches of the interference fringes are inverted relative to each other. Thus, when the amount of movement of the stage 11 takes a value that causes the accumulated error to be an integral multiplication of the line-to-line pitch, then the phases of the patterns match each other, and the overlapping exposure can be performed in an appropriate manner.

Therefore, after the overlapping exposure is carried out ten times with the ten candidate values for the amount of movement P, the exposure conditions applied to the overlapping exposure that allows the pattern to remain are chosen (used) to decide the amount of movement P of the stage 11. As described above, the accumulated error is known from (obtained by) the experiments and the amount of movement P of the stage 11 is appropriately decided. It should be noted that every candidate value for the amount of P has a difference of 10% of the predetermined line-to-line pitch of the interference fringes relative to a next candidate value in the above-described example, but every candidate value may have a difference of 5% of the predetermined line-to-line pitch of the interference fringes and twenty candidate values may be prepared (i.e., the overlapping exposure may be carried out twenty times) if the amount of movement P should be obtained more precisely. Alternatively, every candidate value may have a difference of 2.5% of the predetermined line-to-line pitch of the interference fringes and forty candidate values may be prepared (i.e., the overlapping exposure may be carried out forty times) if the amount of movement P should be obtained more precisely.

As understood from the foregoing, this embodiment uses the two-beam interference exposure such that the interference area E1 is masked to a desired shape, and the target surface of the substrate (workpiece W) is irradiated with the interference pattern while the substrate placed on the stage 11 is being moved together with the stage 11. During the overlapping exposure, the interference areas E1 of the consecutive exposure processes overlap partly each other such that the line-to-line pitches of the interference fringes match each other in a direction perpendicular to the longitudinal direction of the interference fringes. Accordingly, no seams are generated between each two consecutive shots, and the interference areas E1 are formed over the entire surface of the substrate without gaps. Thus, it is possible to easily perform the interference exposure to the large substrate in a continuous manner.

Figure 9A:
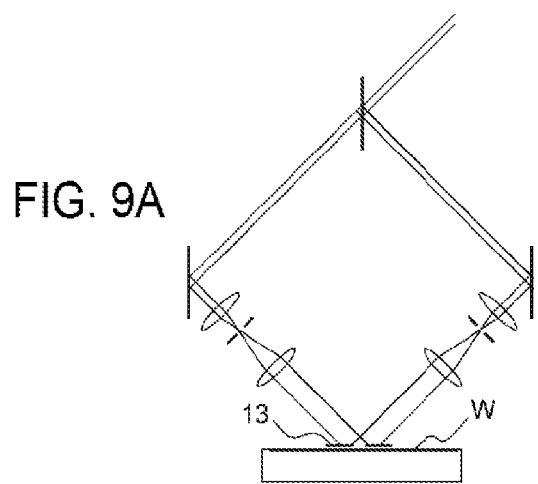
FIG. 9A illustrates a schematic structure of the exposure device used to carry out the exposure method according to the first embodiment of the present invention.
Figure 9B:
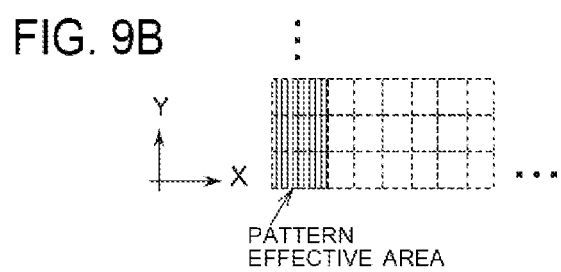
FIG. 9B illustrates the exposure pattern of the exposure method of the first embodiment. 1.5
Figure 9D:
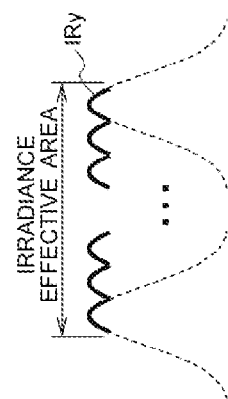
FIG. 9D illustrates the irradiance distribution in the Y-direction.
Figure 9C:
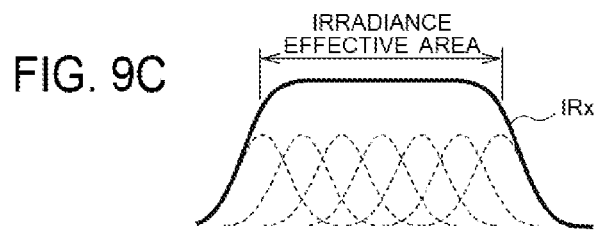
FIG. 9C illustrates the irradiance distribution in the X-direction.

Referring now to FIG. 9A to FIG. 9D, the exposure method according to this embodiment will be described. FIG. 9A schematically shows a structure of an exposure device for this exposure method. FIG. 9B shows an exposure pattern. FIG. 9C shows an irradiance distribution IRx in the X-direction, and FIG. 9D shows an irradiance distribution IRy in the Y-direction. As illustrated in FIG. 9A, the mask 13 is disposed over the workpiece W such that the pattern effective area is masked to a rectangular shape. As shown in FIG. 9B, a plurality of pattern effective areas are overlapped in the X-direction. Thus, as shown in FIG. 9C, a plurality of irradiance distributions, which are indicated by the broken line curves, are integrated in the X-direction of the workpiece W to a flat combined distribution IRx, as indicated by the solid line curve. In the Y-direction, the pattern effective areas are not overlapped each other, but are arranged continuously without gaps. Therefore, as shown in FIG. 9D, a plurality of irradiance distributions, which are indicated by the broken line curves, are integrated in the Y-direction of the workpiece W to a generally flat combined distribution IRy or a distribution having less fluctuations, as indicated by the solid line.

Figure 10A:
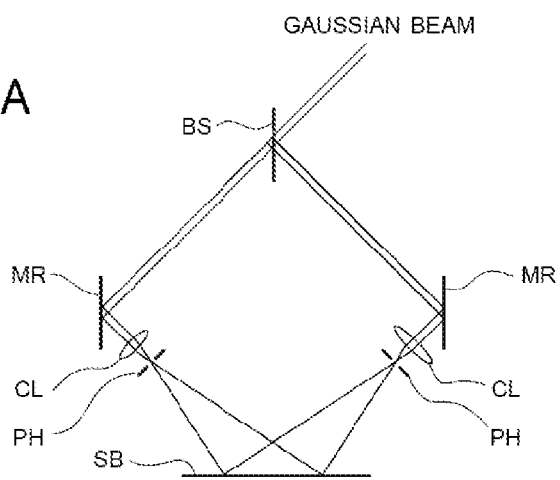
FIG. 10A illustrates a schematic structure of an exposure device used to carry out a conventional exposure method.
Figure 10B:
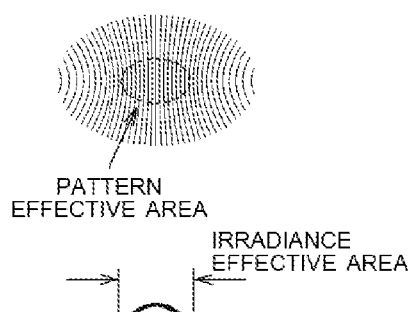
FIG. 10B illustrates the exposure pattern of the conventional exposure method.
Figure 10C:
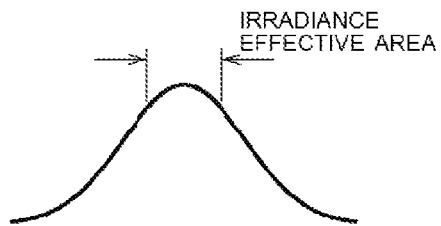
FIG. 10C illustrates the irradiance distribution in the X-direction.

A two-beam interference exposure method will be described with reference to FIG. 10A to FIG. 10C. This exposure method is an all-at-once exposure method. FIG. 10A schematically illustrates an exposure device, FIG. 10B illustrates the exposure pattern, and FIG. 10C illustrates the irradiance distribution in the X-direction. As shown in FIG. 10A, this exposure method uses a Gaussian beam, and the Gaussian beam is divided into two branch beams by a beam splitting element BS. The two branch beams are reflected by associated mirrors MR respectively. Each of the reflected beams is condensed by an associated condenser lens CL. The condensed beam passes through an associated pin hole element PH such that the beam diameter is expanded. Then, the substrate SB is irradiated with the two beams. However, the beams directed to the substrate SB are spherical waves. Thus, in the exposure pattern formed by the beams (spherical waves), the accumulated line-to-line pitch errors increase toward the edges of the exposure area, as shown in FIG. 10B. Specifically, as shown in FIG. 10B, the accumulated line-to-line pitch errors have a hyperbolic shape. If the substrate (workpiece) must be irradiated with the beam pattern having a plurality of lines at equal intervals, it is preferred that the accumulated line-to-line pitch errors be equal to or smaller than 10% of the line-to-line pitch. Thus, it is preferred that the pattern effective area be limited to a center area of the beam pattern, as indicated by the broken line oval in FIG. 10B.

The irradiance of the Gaussian beam decreases from the center of the beam toward the periphery of the beam. Therefore, the line width of the exposure pattern at the beam center is different from the line with of the exposure pattern at the beam periphery. For example, when the resist is a positive type (the exposed part of the resist dissolves upon development), the line width is small in the beam center area and the line width is large in the beam peripheral area. Because the line width of the exposure pattern formed on the substrate is different from the beam center area to the beam peripheral area, it is preferred that the pattern effective area be limited to the beam center area, as shown in FIG. 10B, in order to suppress the line width variations in the exposure pattern. Though the size of the pattern effective area depends upon the use of a final product, the pattern effective area occupies generally 10% to 50% of the exposure pattern in the beam center area, preferably 10% to 30% of the exposure pattern, and more preferably 20% of the exposure pattern.

However, when the pattern effective area is limited to the beam center area, the irradiance effective area correspondingly becomes smaller, as shown in FIG. 10C. When a large area should be exposed, it is then necessary to ensure a long distance from the spatial filter (pin hole element) to the substrate. This increases the size of the exposure device. For example, it is assumed that the interference fringes have a 130 nm line-to-line pitch and the entire surface of an 8-inch wafer (wafer diameter is 200 mm) is exposed with the interference fringes by an all-at-once exposure process. It is also assumed that the wavelength $\lambda$ is 248 nm, the interference angle $\theta$ is 72 degrees, the NA (numerical aperture) of the condenser lens is 0.20, and the exposure effective area is 10%. Then, the accumulated line-to-line pitch errors become approximately 7.5 µm at maximum, and the distance from the spatial filter to the substrate should be approximately 5100 mm. Because the distance from the spatial filter to the substrate is long, there is a concern that the interference fringes are (or the exposure process is) likely to be influenced by environmental variations. Also, if the beam diameter is expanded, the exposure time correspondingly becomes longer. Specifically, the exposure time increases in proportion to the square of the beam diameter. Therefore, the interference fringes are easily influenced by the environmental variations. For example, when the refractive index n changes due to vibrations and/or the environment temperature changes, then the line-to-line pitches of the interference fringes change (fluctuate) during the exposure process. This would result in abnormal exposure. In order to avoid the abnormal exposure, separate equipment for stabilizing the exposure process is required.

In this embodiment, on the contrary, the substrate W is conveyed stepwise by the stage 11 such that a plurality of small areas are exposed by a series of exposure processes, as described above. Thus, it is possible to reduce the distance from the optical element to the substrate, as compared to the configuration shown in FIGS. 10A-10C. Accordingly, the exposure device does not have to have a large size, but it is still possible to expose a large substrate. Also, the exposure processes are not affected very much by the environmental variations. In this embodiment, the interference areas E1 are overlapped each other during a series of exposure processes such that the line-to-line pitches of the interference fringes of one exposure process are aligned with the line-to-line pitches of the interference fringes of a subsequent exposure process when the substrate is conveyed in a direction perpendicular to the longitudinal direction of the interference fringes. Thus, no seams are generated between each two consecutive shots (each two consecutive exposure processes). The interference areas E1 are arranged over the entire surface of the substrate without gaps. As a result, a plurality of irradiance distributions are integrated on the surface of the substrate, and these distributions ultimately become a single flat distribution of irradiance upon integration. Consequently, it is possible to apply a uniform interference exposure to a large substrate.

When the two-beam interference exposure method is the step-and-repeat method, the two-beam interference exposure method may not use a mask to change the shape of the exposure area unlike this embodiment (this embodiment uses the mask 13). The schematic structure of an exposure device that carries out such exposure method is shown in FIG. 11A. In this exposure method, the pattern effective area has an oval shape, as shown in FIG. 11B. Therefore, in order to have a flat distribution of irradiance over the entire surface of the substrate upon integration of a plurality of irradiance distributions, the pattern effective areas should be superposed one after another in both the X-direction and the Y-direction, as shown in FIG. 11B. FIG. 11C is similar to FIG. 9C, and shows a combined (integrated) irradiance distribution IRx in the X-direction. FIG. 11D is similar to FIG. 9D and shows a combined irradiance distribution IRy in the Y-direction. The irradiance distribution IRy of FIG. 11D is flat.

When the exposure process shown in FIG. 11A to FIG. 11D is used, the exposure area is not masked to a particular shape because there is no mask 13. Therefore, the edges of the beams are used when the overlapping exposure is carried out. However, the lenses have aberrations and there are alignment errors with regard to the lenses. Thus, the interference fringes may not become parallel fringes at the edges of the beams. In such case, when the edges of the beams are used in the overlapping exposure, a structure formed on the substrate by the overlapping exposure may have defects.

On the contrary, in the embodiment of the present invention, the exposure area s masked to a predetermined (desired) shape by the mask 13. Thus, the edges of the beams, which would cause defects (e.g., insufficient exposure due to weakening of the beam intensity, accumulated line-to-line pitch errors, and alignment errors), are cut off. Accordingly, the overlapping exposure can be carried out at high precision.

Figure 12A:
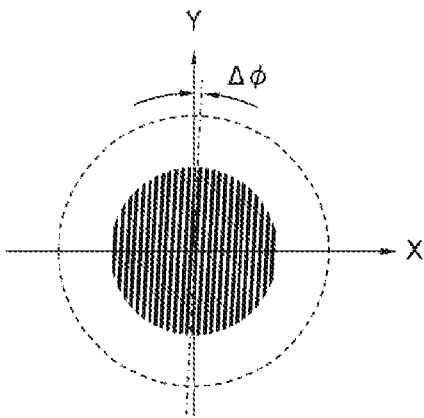
FIG. 12A is a view useful to describe a problem that would be encountered when the interference fringes do not overlap in a desired manner.
Figure 12B:
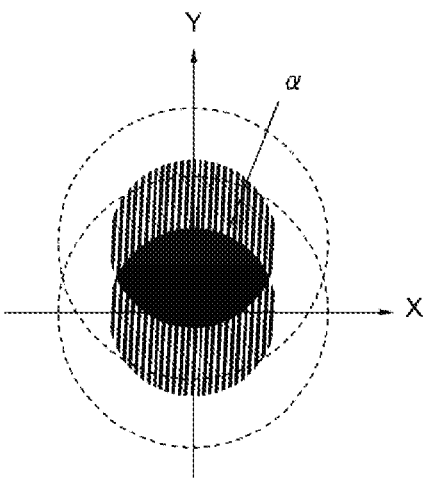
FIG. 12B is another useful to describe the problem that would be encountered when the interference fringes do not overlap in a desired manner.

When the exposure process of FIGS. 11A-11D is used, the pattern effective area has an oval shape. Thus, it is necessary to cause the pattern effective areas to overlap in the direction along the interference fringes (in the Y-direction). As shown in FIG. 12A, however, if the angle of the interference fringes has a discrepancy or deviation $\Delta\varphi$ relative to the stage conveyance direction (Y-direction), then the interference fringes may not overlap (align with) each other appropriately in a particular region $\alpha$, as shown in FIG. 12B, depending upon the moving direction of the stage and/or the moving amount of the stage. This would cause a problem in the region $\alpha$, i.e., the line-to-line pitches of one exposure process cancel the line-to-line pitches of another exposure process. In order to avoid this problem, a mechanism and equipment for precisely detecting the angle of the interference fringes on the work surface are needed, and a mechanism and equipment for correcting (adjusting) the interference fringes are needed.

In the embodiment of the present invention, on the other hand, the interference areas E1 are not overlapped in the Y-direction. Thus, it is possible to avoid the problem (defects in the structure formed on the substrate) that would be caused if the interference areas were overlapped in the Y-direction. Also, it is not necessary to prepare mechanisms and equipment for detecting and adjusting the interference fringes. Because the interference areas are not overlapped in the Y-direction in the embodiment of the invention, it is also possible to suppress a drop in the throughput.

As described above, the embodiment uses the two-beam interference exposure, and the substrate on the stage is conveyed stepwise such that a plurality of small areas are exposed successively during the exposure process. Accordingly, the exposure device does not have to have a large size, but the exposure device is still able to expose a large substrate. Thus, the cost, which would be needed if the exposure device was designed large, is not necessary. Also, the interference area, which is irradiated with the interference pattern, is masked to a desired shape and the two-beam interference exposure is carried out. Further, the interference areas are overlapped in the substrate conveying direction such that the line-to-line pitches of the interference fringes of one shot are aligned with the line-to-line pitches of the interference fringes of another shot. Thus, it is possible to create a structure that includes a series of structure segments on the large surface of the large substrate.

Because the interference area has two sides that are parallel in the X-direction (e.g., the interference area has a rectangular shape), the interference areas do not have to overlap in the Y-direction. Specifically, the interference areas overlap each other only when the substrate is conveyed in the X-direction (i.e., the direction in which the no interference areas are formed next to the interference area), and the interference areas do not overlap each other when the substrate is conveyed in the Y-direction (i.e., the direction in which the no interference areas are not formed next to the interference area). In the Y-direction, therefore, the interference areas do not overlap each other but are present side by side. Because the interference area has two sides that are parallel in the X-direction (e.g., the interference area has a rectangular shape), it is possible to arrange the interference areas over the workpiece surface without gaps in the Y-direction, even if the interference areas do not overlap in the Y-direction. Accordingly, it is possible to provide a structure that includes a series of continuous segments on the surface of the workpiece W.

As compared to the exposure method that requires the overlapping of the interference areas in the Y-direction, the exposure method of this embodiment can reduce the number of shots to the substrate, and can improve the throughput. In addition, because the overlapping of the interference areas in the Y-direction is not necessary, it is possible to avoid the defects shown in FIG. 12B on (in) the structure formed on the substrate.

Because the mask 13, which is the light blocking member having a light transmitting portion, is disposed over the substrate W, it is relatively easy to mask the interference area to a desired shape. Because there is a gap D between the substrate W and the mask 13, it is possible to prevent particles or the like from adhering to the substrate, which would otherwise be caused due to the close contact between the substrate and the mask 13.

The exposure method of the embodiment may be used in a process of manufacturing, for example, an FBG (Fiber Bragg Grating). The FBG is one type of optical fiber, and used to measure temperature and/or strains (deformation). The FBG takes advantage of the periodic changes of the refractive index in an optical fiber. In the FBG, segments having different refractive indices are alternately arranged. With such structure, the FBG only reflects the light having a particular wavelength $\lambda b$ among the light propagating through the optical fiber, and allows the light having other wavelengths to pass therethrough. The wavelength $\lambda b$ depends upon the period $\Lambda$ of the refractive index and the effective refractive index ne of the optical fiber. The relation of $\lambda b=2ne\Lambda$ is established. Thus, when the periodic structure of the FBG changes due to temperature and/or strains, then the wavelength of the light propagating through the optical fiber changes, and the temperature or the strain is measured from the change in the wavelength $\lambda$. Accordingly, the FBG may be used as the temperature sensor or the strain sensor.

In order to manufacture the structure having the periodically changing refractive index such as the FBG, a photosensitive material may be irradiated with light that has periodically changing optical intensity. Thus, the two-beam interference exposure is suited for manufacturing the FBG. In the embodiment of the invention, the two-beam interference exposure is able to expose a large substrate at a high throughput. Thus, when the FBG is manufactured, it is possible to carry out the exposure process to a plurality of optical fibers at high speed.

When the exposure method of the embodiment is utilized in the method of manufacturing the FBG, as described above, the physical property or characteristics that correspond to the interference fringes of the interference pattern are imparted to the optical fiber by the exposure method. There is another use of the exposure method of the embodiment. Specifically, the exposure method may be used to form a shape that corresponds to the interference fringes of the interference pattern. For example, the laser ablation is caused to occur by a high-output pulse laser, and the exposure method utilizes the laser ablation to directly form (machine) the interference fringes on the substrate. There is still another use of the exposure method of the embodiment. Specifically, light curing resin may be exposed by the exposure method of the embodiment to cure the resin. The cured resin provides a fine structure that has a shape corresponding to the interference fringes. Therefore, the exposure method may be used for the surface reforming (modification) of the substrate, or in a method of manufacturing a photonic crystal structure. In the embodiment of the invention, the two-beam interference exposure is able to expose a substrate having a large surface at high throughput, and therefore the exposure method of the embodiment is suited for the surface reforming of the large workpiece, and for the high-speed manufacturing of the photonic crystal structure.

The above-described exposure method may also be applied in a method of manufacturing a grid polarizer. The polarizer designed to provide polarized light is known in the form of various products such as customer goods (e.g., polarized sunglasses) and optical elements (e.g., polarizing filters and polarizing films). The polarizer is also used in various types of display devices such as liquid crystal display devices. In general, the polarizer can be categorized into a plurality of groups depending upon a method of extracting polarized light. One of the groups is a wire grid polarizer.

The wire grid polarizer includes a transparent substrate and a fine stripe grid disposed on the transparent substrate. The grid is made from metal (e.g., aluminum). The grid has a plurality of linear portions spaced from each other. The wire grid polarizer can function as a polarizing element when the gap between each two adjacent linear portions of the grid is smaller than the wavelength of light to be polarized. The wire grid polarizer is equivalent to a flat metal for that polarized light, among the linearly polarized light, which has an electric field component in a longitudinal direction of the grid (length direction of each linear portion). Thus, the wire grid polarizer reflects such polarized light. On the other hand, the wire grid polarizer is equivalent to the mere transparent substrate for that polarized light, among the linearly polarized light, which has the electric field component in a direction perpendicular to the longitudinal direction of the grid (length direction of each linear portion). Thus, the wire grid polarizer allows such polarized light to pass (transmit) through the transparent substrate and become the outgoing light (emitted light). Thus, the linearly polarized light is only emitted from the wire grid polarizer in the direction perpendicular to the longitudinal direction of the grid. If a posture or orientation of the wire grid polarizer is appropriately controlled such that the longitudinal direction of the grid is directed to a desired direction, then it is possible to obtain the polarized light that has an axis of polarization (direction of the electric field component) directed to a desired direction.

In the following description, the linearly polarized light that has an electric field component in the longitudinal direction of the grid is referred to as an "s polarized light" and the linearly polarized light that has an electric field component in a direction perpendicular to the longitudinal direction of the grid is referred to as "p polarized light" for the sake of description. Generally, a wave that has an electric field perpendicular to an incident plane (plane perpendicular to a reflecting plane, and including incident light and reflected light) is referred to as "s wave," and a wave that has an electric field in parallel to the incident plane is referred to as "p wave." In this specification, the longitudinal direction of the grid is assumed to be perpendicular to the incident plane (plane of incidence), and the "s polarized light" and the "p polarized light" are defined as described above.

Fundamental indices used to indicate the performances (capabilities) and features (properties) of such polarizer include an extinction ratio ER and a transmissivity (transmittance) TR. The extinction ratio ER is a ratio (Ip/Is) of an intensity (Ip) of the p polarized light among the polarized light, which has transmitted through the polarizer, to an intensity (Is) of the s polarized light among the polarized light. Generally, the transmittance TR is a ratio of an energy of the outgoing p polarized light to a total energy of the incident s polarized light and p polarized light (TR=Ip/(Is+Ip)). The extinction ratio ER of an ideal polarizer is infinite, and the transmittance of the ideal polarizer is 0.5 (50%). In general, a polarizer that has a grid made from metallic linear portions is called "wire grid polarizer." In the following description, the "grid polarizer" includes a grid polarizer that has a grid made from other than metal, and also includes the wire grid polarizer.

In order to manufacture the grid polarizer, firstly a thin film, which will become a grid, is formed on a transparent substrate. The material of the thin film is, for example, an inorganic dielectric. Subsequently, a photoresist is applied on the thin film. Then, the exposure method of the above-described embodiment is used to expose the photoresist, and the developing process is applied to obtain the resist pattern.

After that, an etchant is supplied to the resist pattern and the thin film such that those portions of the thin film which are not covered with the resist pattern are etched. This etching is an anisotropic etching. The anisotropic etching is performed with an electric field being applied in the thickness direction of the thin film. The anisotropic etching causes the thin film to have a particular pattern. Finally, the resist pattern is removed such that the grid polarizer is provided.

Second Embodiment

A second embodiment according to the present invention will be described below.

In the first embodiment, the substrate is irradiated with the stripe-shaped interference pattern. In the second embodiment, the substrate is irradiated with a lattice-shaped interference pattern.

Similar to the first embodiment, the interference areas E1 of consecutive shots are overlapped such that the line-to-line pitches of the interference fringes of the consecutive shots match each other in a direction perpendicular to the extending direction of the interference fringes, and the interference areas E1 are not overlapped but are formed next to each other in the extending direction of the interference fringes when the workpiece W is exposed in the second embodiment.

Figure 13A:
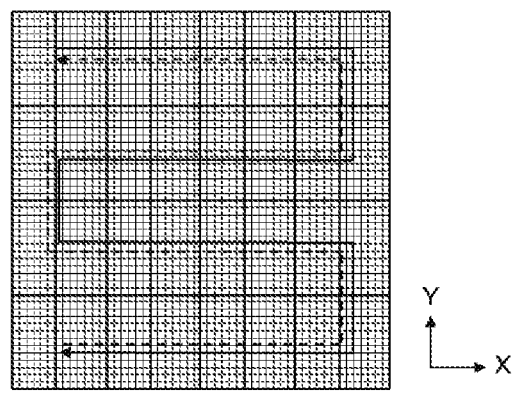
FIG. 13A shows an exposure method according to a second embodiment of the present invention, which includes the first exposure and the second exposure.
Figure 13B:
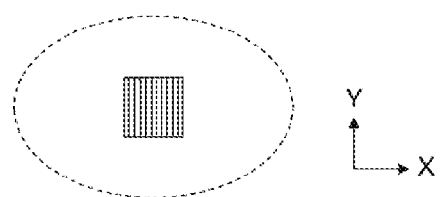
FIG. 13B shows the exposure light in the second exposure.

In this embodiment, the exposure is applied to the work W a plurality of times (twice). The first exposure is an exposure of a first halfway, and the second exposure is an exposure of a returning way (second half way). In the first exposure, the work W is irradiated with the interference beam that moves along a path indicated by the arrow of the broken line in FIG. 13A. In the second exposure, the work W is irradiated with the interference beam that moves along an opposite path (returning path) indicated by the arrow of the solid line in FIG. 13A. In the first exposure, the entire work W is irradiated with the interference beam that has, for example, a strip shape extending in the Y direction, as shown in FIG. 13B. After the first exposure, the interference beam is rotated by a predetermined angle from the interference beam (first interference beam) of the first exposure, and the resulting interference beam is used as the second interference beam that is applied to the work W in the second exposure.

Figure 13C:
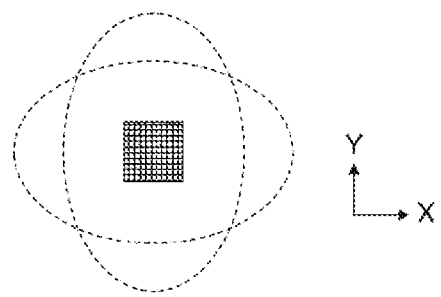
FIG. 13C shows the interference pattern that is obtained by superposing the first interference pattern and the second interference pattern.
Figure 14:
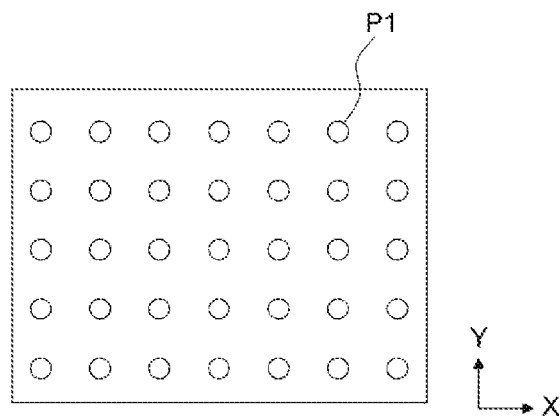
FIG. 14 shows a resist pattern obtained when the first exposure and the second exposure are carried out, with the interference pattern being turned 90 degrees after the first exposure.

When the stripe interference pattern is turned from the first interference beam by 90 degrees in order to perform the second exposure, the second interference pattern becomes a stripe interference pattern as shown in FIG. 13C, with the stripe extending in the X-direction. This interference pattern is directed to the entire work W. Accordingly, the work W is irradiated with the first interference beam and the second interference beam in an overlapping manner. When the turning angle δ of the interference beam is 90 degrees, and the above-described exposure is carried out, then it is possible to form a lattice pattern on the entire surface of the substrate. For example, if the photosensitive material film (resist or the like) applied on the substrate is a positive resist or the like that allows those portions which are irradiated with the interference beam to dissolve, then the above-described exposure method is used to carry out the exposure such that the portions irradiated with the interference beam in the lattice shape are dissolved, and a plurality of columns (circular cylinders) remain in the resist pattern. In this case, as shown in FIG. 14, a fine pattern has a plurality of columns (dots) P1 that are arranged in a square array. On the other hand, when the photosensitive material layer is a negative type, in which the portions irradiated with the light cross link each other and do not dissolve in the developer (developing solution), the above-described exposing method is used such that those portions which are irradiated with the beam in the lattice fashion remain after the developing process. Thus, a pattern that has square recesses and/or circular recesses can be formed.

Figure 15:
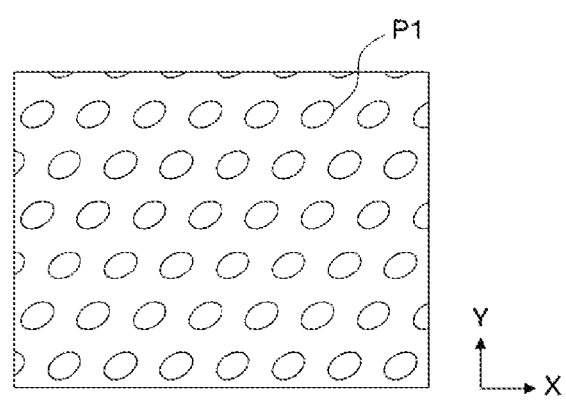
FIG. 15 shows a resist pattern when the first exposure and the second exposure are carried out, with the interference pattern being turned 60 degrees after the first exposure.

In this embodiment, the shape of the inference area E1 (i.e., the shape of the opening of the mask 13) may have an arbitrary shape. For example, the interference area E1 has a square or rectangular shape. In FIG. 13A, the shape of the interference area E1 is square. It should be noted that the turning angle δ of the interference beam from the first exposure to the second exposure is not limited to 90 degrees. The turning angle δ of the interference beam may be an arbitrary angle that is greater from zero (not inclusive) to 90 degrees (inclusive) (i.e., 0 degree <δ≤90 degrees). When the turning angle δ of the interference beam is altered, it is possible to alter the shape of the interference beam directed to the work W. For example, the turning angle δ of the interference beam may be 60 degrees. In this instance, the longitudinal direction of the interference fringes in the first exposure crosses the longitudinal direction of the interference fringes in the second exposure at 60 degrees, and the shape of each dot P1 has a generally oval shape in the X-Y plane, as shown in FIG. 15. The dot pattern has a plurality of oval columns (dots) P1 that are arranged in a trigonal array. As described above, when the interference pattern used in the first exposure is turned 60 degrees and used in the second exposure (FIG. 13C), the dot pitch is reduced, as compared to when the interference pattern used in the first exposure is turned 90 degrees and used in the second exposure. Thus, it is possible to fabricate a resist pattern having a desired dot density in the X-Y plane by altering the angle (direction) of the interference pattern between the first exposure and the second exposure.

It should be noted that when the second exposure (or a subsequent exposure process after the second exposure) is carried out, the interference beam may be turned or the stage 11 that supports the work W thereon may be turned. Preferably, the stage 11 is turned because the second and subsequent exposure processes are easy to perform.

In this embodiment, a heat treatment may be applied to the obtained resist pattern such that the dots in the pattern have a desired shape.

The inventors found that the pattern (dot) P can have a perfect circular shape if a heat treatment is properly applied to the resist pattern obtained after the above-described exposure and development. In this embodiment, therefore, the resist pattern may be shaped to a perfect circle by heating the resist pattern at a temperature that is higher than the glass-transition temperature of the resist.

Figure 16:
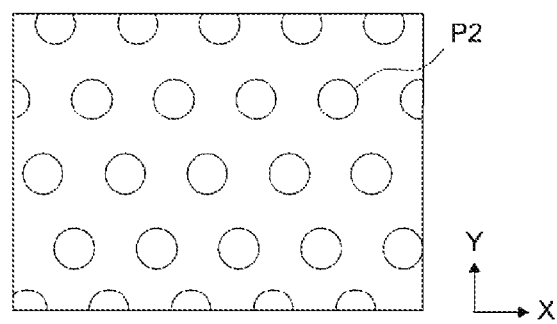
FIG. 16 shows a resist pattern when the heat treatment is applied for the shaping.

For example, the glass-transition temperature of the resist is approximately between 140 degrees C. and 150 degrees C. The heat treatment was applied to the resist at the temperature of 200 degrees C. for ten minutes. When the heat treatment is applied to the resist pattern at a temperature over the glass-transition temperature of the resist, the resist pattern is shaped to a desired shape, and the resist pattern has a perfect circular shape (true circular shape) after the heat treatment. Specifically, the oval shape of the dot P1 before the heat treatment, as shown in FIG. 15, is shaped to a perfect circle after the treatment, as shown in FIG. 16. Thus, it is possible to obtain the perfect circular dot pattern in the trigonal array.

As described above, it is possible to fabricate the resist pattern having a desired dot density in the surface of the resist (X-Y plane) by altering the turning angle (angle difference) of the interference pattern between the first exposure and the second exposure. Thus, it is possible to manufacture the resist pattern having perfect circular dots at a desired density by carrying out the exposure a plurality of times with an appropriate angle difference between the first interference beam and the second interference beam, and carrying out the heat treatment under appropriate conditions after the development.

The resist, which is obtained after the heat treatment in the above-described manner, is used as a mask, and an etching is applied to the substrate, which has the resist on top thereof, or the functional material layer disposed on the substrate. As a result, those portions of the substrate or the functional material layer which are not covered with the resist are removed by the etching process. Accordingly, the surface of the substrate or the surface of the functional material layer has a convex structure. This convex structure has a plurality of convex portions at two-dimensional periods. This convex structure is a moth eye structure. Therefore, it can be said that the substrate has a moth eye structure thereon. As described above, each dot in the resist pattern after the heat treatment is shaped to a perfect circular shape. Accordingly, it is possible to fabricate a highly precise moth eye structure with each dot (eye) having a perfect circular shape at its bottom.

It should be noted that the heating conditions in the heat treatment, such as the heating temperature and the heating time, may be adjusted to alter the size of the dot(s) in the resist pattern. When the heating temperature of the heat treatment is raised, the dot diameter becomes larger even if the heating time is unchanged. Thus, the spacing between neighboring fine structures (dots) becomes smaller. In other words, the distance between the adjacent fine structures (dots) decreases in the resist pattern, and the fine structures are arranged close(r) to each other. Thus, the dot diameter can be altered upon the heat treatment, by altering the heating conditions of the heat treatment. This can change the density of the fine structures (dots) to be made in the surface of the resulting moth eye structure.

It should be noted that although the heating temperature is altered in the foregoing, the heating time may additionally be altered or the heating time may be altered instead of the heating temperature. It is also possible to change the dot diameter upon the heat treatment, if the heating time is changed. In order to obtain a desired dot diameter (or a desired dot density of the resist pattern), the heating conditions may be appropriately altered or adjusted in accordance with the material of the resist, the material of the substrate located under the resist, or other factors.

In order to manufacture the structure, which has a moth eye structure, on the substrate, firstly a substrate is prepared. The substrate has a functional material layer thereon. The substrate is a silica substrate ($SiO_2$ substrate) or the like. The functional material layer is made from, for example, zirconia ($ZrO_2$). The functional material layer may be formed on the substrate by a deposition method such as sputtering. It should be noted that the material of the substrate and the material of the functional material layer may be appropriately decided in accordance of use of a final product or other factors.

In the first step of the manufacturing method, a photosensitive material layer (e.g., photoresist layer) is formed on the surface of the functional material layer. In the second step of the manufacturing method, the above-described two-beam interference exposure is applied to the photoresist a plurality of times in order to expose the photoresist. In the third step of the manufacturing method, the exposed photoresist is developed. Thus, those portions of the photoresist which are irradiated with the interference beams are removed, and a fine pattern is created. The fine pattern has a dot pattern. In the fourth step of the manufacturing method, the heat treatment is applied to the fine pattern of the photoresist, which is obtained in the third step. This is a step of shaping the fine pattern. The oval shape of each dot in the fine pattern is shaped to a circular shape by the shaping step. During the shaping step, the heat treatment may be performed with, for example, a hot plate. As a result, the fine pattern is obtained. The fine pattern has a hemispherical shape in its vertical cross-sectional view.

In the fifth step of the manufacturing method, the fine pattern, which is obtained in the fourth step, is used as a mask to carry out the etching to the functional material layer. Subsequently, the fine pattern of the photoresist is removed to obtain the fine pattern in the functional material layer. In the final step of the manufacturing method, the sputtering is applied to the fine pattern of the functional material layer, which is obtained in the fifth step. As a result, the substrate that has a moth eye structure thereon is obtained.

In the exemplary method described above, the fine structure is formed on the surface of the functional material layer disposed on the substrate. It should be noted that the present invention is not limited in this regard. For example, the fine pattern of the photoresist may be formed on the surface of the substrate, and the fine pattern may be used as the mask to carry out the etching to the substrate. Then, it is possible to form the moth eye structure on the surface of the substrate.

The resulting structure on the substrate may be used as an optical element such as a polarizing element or an antireflection element, or a semiconductor light-emitting element such as a fluorescent light source or an LED, or other devices.

As described above, in this embodiment, the single beam emitted from the coherent light source is divided into two beams, and the two beams are forced to cross each other at the predetermined interference angle such that the interference beams are produced. These interference beams are used to expose the photoresist. In the exposure process, the two-beam interference exposure is carried out a plurality of times. In the second and subsequent interference exposure, the longitudinal direction of the interference fringes applied to the photoresist is turned such that the longitudinal direction of the interference fringes of the second interference exposure intersects the longitudinal direction of the interference fringes applied to the photoresist in the first interference exposure at the predetermined angle. After the exposure, the development process is applied to the resist pattern to obtain the fine resist pattern.

The two-beam interference exposure does not use a fine photomask, but is still able to expose an object (work) with a fine pattern. In the two-beam interference exposure, nothing contacts the work. Thus, the two-beam interference exposure improves the yield, as compared to the NIL or the like which requires the contact between the work and the master mold every time the fine processing is carried out (every time the fine concave-convex pattern is transferred to the work from the master mold). Also, the two-beam interference exposure can expose the work at a very deep depth of focus. Thus, the flatness of the work does not matter in the two-beam interference exposure. For example, the nanoimprint method may damage or break the work if the work has a bending portion. Further, the transfer process in the nanoimprint method may become insufficient if the work has a bending portion. In view of such facts, the two-beam interference exposure is employed in the embodiment of the present invention. The two-beam interference exposure is employed because the exposure can precisely be carried out even if the work has a bending portion.

In the nanoimprint method, the frequent contact between the work and the master mold deteriorates (damages) the master mold. Thus, the master mold needs to be monitored and replaced. On the other hand, the two-beam interference exposure does not need such monitoring and replacement. The two-beam interference exposure can ensure the stable quality without such monitoring and replacement. Furthermore, unlike the nanoimprint method, the two-beam interference exposure does not need a master mold, which is expensive and consumable. Thus, the two-beam interference exposure can reduce the cost.

It is possible to improve the accuracy of the resist pattern by heat treating the fine pattern, which is obtained after the development process, and shaping the fine pattern. If the heat treatment is carried out at a temperature over the glass-transition temperature, then the fine pattern having anisotropy is naturally (automatically) shaped to the fine pattern having isotropy due to the surface tension.

Thus, the fine projections and/and recesses (convexes and/or concaves) are arranged on the work at two-dimensional periods by carrying out the etching process with the above-described photoresist. The work can therefore have a fine structure that has a regulated (controlled) shape. In particular, therefore, when the resist pattern is a dot pattern, it is possible to manufacture a fine structure having a very precise moth eye structure.

In this embodiment, the arrangement of the dots in the resist pattern can be altered by altering the turning angle of the interference pattern from the first exposure to the second exposure in the interference exposure step. In addition, the shape of the resist pattern can be altered by altering the heating conditions of the heat treatment. Thus, it is possible to manufacture a moth eye structure that has a desired arrangement and a desired dot intensity in the X-Y plane.

The material of the substrate on which the fine structure is formed may be decided appropriately on the basis of use of the fine structure or the final product. For example, the structure on the substrate manufactured by the method of this embodiment, which has a moth eye structure, may be used as a master mold for a nanoimprint method.

In this embodiment, the step-and-repeat method is used in the two-beam interference exposure. Thus, it is possible to expose a large surface of the substrate (i.e., the large substrate) without increasing the size of the exposure device. In the two-beam interference exposure, the interference area E1 is masked to a desired shape, and the interference areas E1 of the respective shots are overlapped each other in the substrate conveying direction. Thus, it is possible to apply the interference exposure to a large surface of the substrate without generating seams between the shots.

It should be noted that the resist pattern is a dot pattern in the second embodiment, but the present invention is not limited in this regard. For example, when the resist is a negative resist, those portions which are irradiated with the exposure light in the lattice shape (irradiated with the lattice-shaped exposure light) remain after the developing process, and the resulting pattern on the substrate surface has a plurality of holes or recesses. After the developing process, the above-described heat treatment is applied to the resist pattern. Accordingly, the recesses are shaped to desired recesses having no anisotropy.

Modifications

In each of the above-described embodiments, the interference area E1 is shaped to a rectangular shape. It should be noted, however, that the interference area E1 may have any suitable shape, as described above. It should also be noted that when the shape of the interference area E1 has two sides that are parallel in the X-direction (i.e., the direction in which the no interference areas E2 are arranged next to the interference area E1), the interference areas E1 do not have to overlap in the Y-direction. This is the case when the shape of the interference area E1 is rectangular, and such shape is a preferred shape. A parallelogram and a rhombus are also preferred.

In each of the above-described embodiments, the interference areas E1 do not overlap in the Y-direction (i.e., the direction in which the no interference areas E2 are not formed next to the interference area E1). It should be noted, however, that the overlapping exposure may be performed in the Y-direction (i.e., the direction along the interference fringes) if mechanisms and equipment for detecting and adjusting the interference fringes are provided such that the defects (e.g., the defect shown in FIG. 12B) do not occur in (on) the structure formed on the substrate. In this case, the intensity distribution over the surface of the workpiece W becomes flat in both the X-direction and the Y-direction. As mentioned above, a satisfactory (effective) large pattern is obtained over the large surface of the workpiece W even when the interference areas E1 do not overlap each other in the Y-direction (the interference areas E1 are present side by side in the Y-direction), and the throughput tends to drop if the overlapping exposure is performed in the Y-direction. In addition, an alignment process is needed to eliminate the difference between the direction (angle) of the interference fringes on the substrate and the conveying direction of the stage if the overlapping exposure is performed in the Y-direction. Thus, preferably the interference areas E1 are not overlapped in the Y-direction, but are formed side by side in the Y-direction.

In each of the above-described embodiments, the interference areas E1 are arranged over the entire surface of the workpiece W, which is irradiated with the exposure light, without gaps. The present invention is not limited in this regard. For example, the interference areas E1 may discretely be arranged over the surface of the workpiece W. Specifically, some interference areas E1 overlap each other to define a small group of interference areas E1, and a plurality of such small groups are discretely arranged over the surface of the workpiece W. In this configuration, gaps are left between the small groups. The workpiece W may be a single large wafer. The gaps between the small groups may be used as dicing lines (scribing lines) when a plurality of chips are cut from the large wafer. For example, the above-described small groups of the interference areas E1 may be arranged in a matrix fashion on the substrate. Then, it is easy to perform the dicing. It should be noted that the interference areas E1 in each small group may not overlap each other but may be present side by side. The size of the small group of the interference areas E1 may easily be altered depending upon, for example, the number of shots (number of the exposure processes). Thus, this configuration can be applied to various chip sizes. It is also possible to obtain (cut) chips having different sizes from a wafer having a large diameter. The above-described exposure method can be applied when the substrate is irradiated with the stripe-shaped interference pattern as in the first embodiment, and can also be applied when the substrate is irradiated with the lattice-shaped interference pattern as in the second embodiment.

In each of the above-described embodiments, the mask 13 is disposed above the workpiece W with the gap D. The present invention is not limited in this regard. Specifically, the mask 13 may directly be placed on the workpiece W without a gap. The exposure process is applied to the workpiece W, with the mask 13 being in contact with the surface of the workpiece W. In this configuration, there is no sneaking of the beams under the mask 13. In FIG. 2, the beams sneak under the mask 13 (go around into the gap D) and form the no interference areas E2 at opposite edges of the interference area E1. When there is no gap between the workpiece W and the mask 13, there is no sneaking of the beams under the mask 13 so that the interference areas E2 are not formed at the opposite edges of the interference area E1. Consequently, the effective irradiation area E0 is equal to the interference area E1. With this configuration, the above-described overlapping exposure may also be carried out. The overlapping exposure causes the interference fringes to have a flat irradiance distribution in the X-direction, and applies the interference exposure to the substrate having a large area.

Figure 17:
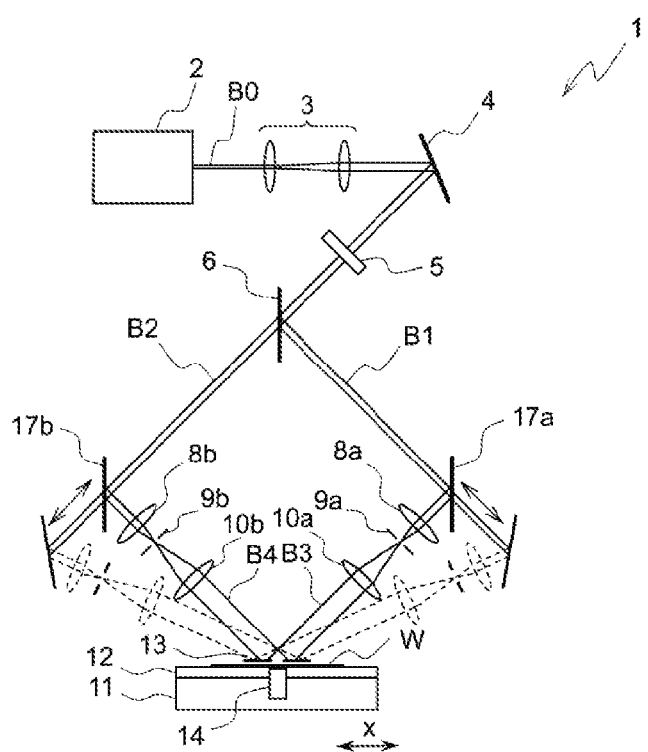
FIG. 17 illustrates a schematic configuration of an exposure device that has an angle-adjustable mirror.

In the above-described embodiments, the turn-around mirrors 7a and 7b are stationary mirrors (FIG. 1). It should be noted that the turn-around mirrors 7a and 7b may be angle-adjustable mirrors. For example, FIG. 17 shows a configuration in which the turn-around mirrors 7a and 7b of the exposure device 1 shown in FIG. 1 are replaced with angle-adjustable mirrors 17a and 17b, as shown in FIG. 17. Each of the angle-adjustable mirrors 17a and 17b of the exposure device 1 is configured to be able to change the angle of the light incident plane. By changing the angle of the light incident plane of each of the mirrors 17a and 17b, the interference angle 20 is changed to a desired angle. As the interference angle 20 changes, the line pitch in the interference fringes (stripe pattern) formed on the substrate changes in a desired manner.

Figure 18A:
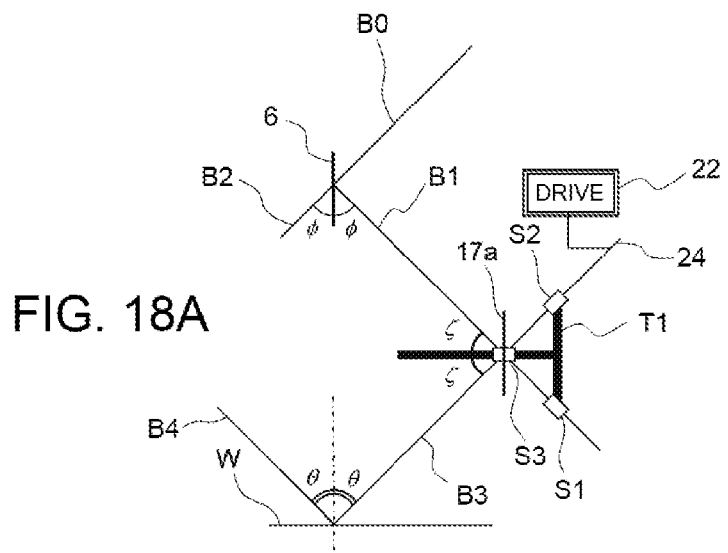
FIG. 18A shows a mechanism of an angle-adjustable mirror.
Figure 18B:
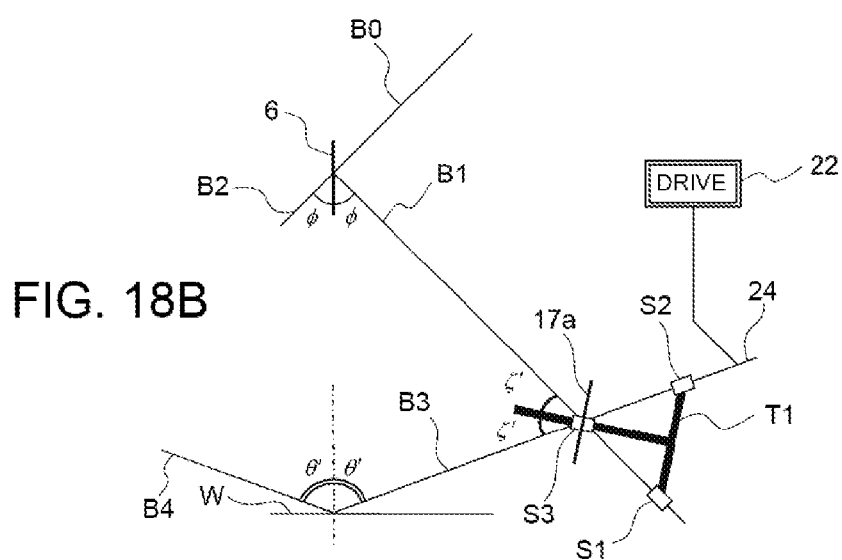
FIG. 18B shows the angle-adjustable mirror that is moved and turned by its mechanism.

FIGS. 18A and 18B illustrate the mirror 17a and a mechanism for changing the angle of the mirror 17a. The mirror 17b is equipped with the same mechanism as the mirror 17a. The mirror 17a has the same configuration as the mirror 17b. The mirror 17a is a component for adjusting (changing) the interference angle $\theta$ to a desired angle $\theta'$. The mirror 17a moves along a straight line defined by the beam B1, which is one of the two branch beams prepared at the beam splitter 6. The mirror 17a can also change its angle (inclination) about an axis that extends through its center in a direction perpendicular to the drawing sheet of FIG. 21A. The beam B1 is reflected by the mirror 17a and becomes the reflection beam B3 (i.e., mirror-reflected beam). The reflection beam B3 is directed to a predetermined location on the work W. The mirror-reflected beam B4 from the mirror 17b (not shown in FIG. 21A) combines (interferes) with the mirror-reflected beam B3 on the work W to create the interference fringes (interference beam). The normal line from the mirror 17a equally divides the angle between the branch beam B1 and the mirror-reflected beam B3 in FIG. 21A.

A method of adjusting the interference angle θ of the beam B3 while maintaining the positional relation between the normal line from the mirror 17a and the reflecting plane of the mirror 17a, for example, includes preparing a T-shaped frame T1, as shown in FIGS. 18A and 18B, and preparing a mechanism that uses (actuates) the T-shaped frame T1. The frame T1 has three sliders S1, S2 and S3. The slider S1 moves along the straight line defined by the branch beam B1 (diagonally downward to the right in FIG. 18A), and the slider S2 moves along the straight line defined by the mirror-reflected beam B3 (diagonally upward to the right in FIG. 18A). The slider S3 moves along the frame T1 (to the left horizontally in FIG. 18A). The mirror 17a is mounted on the slider S3. The slider S1 and S2 are secured to the frame T1.

The location of the rotation axis of the mirror 17a is the intersecting point of the branch beam B1 and the reflection beam B3. When the interference angle θ of the beam B3 is changed to an angle θ', the normal line from the mirror 17a turns in a desired direction, with the normal line from the mirror 17a keeping equally dividing the angle between the branch beam B1 and the reflection beam B3, as shown in FIG. 18B. The interference angle θ decided by the mirror 17a is changed to the angle θ' by a drive unit (actuator) 22. The mirror 17b has the same drive unit as the mirror 17a. One of the drive units 22 is illustrated in FIGS. 18A and 18B. The drive unit 22 applies a force onto a member 24 that extends from the frame T1 along the straight line defined by the reflection beam B3 when the drive unit 22 changes the interference angle θ of the beam B3. It should be noted that the drive unit 22 may directly apply a force onto the frame T1 to change the interference angle θ of the beam B3. The direction of the beam B4 is changed in the same manner by the mirror 17b that is moved by the associated drive unit (not shown).

As described above, the exposure device 1 of this embodiment includes the angle adjustable mirrors 17a and 17b to change the reflecting directions of the beams B1 and B2 (FIG. 17), which are the two branch beams prepared at the beam branching element 6, and direct the reflection beams B3 and B4 toward the substrate or work W such that the two reflection beams B3 and B4 cross each other at a desired angle 2θ' on the work W. Thus, it is possible to arbitrarily alter the pitch of the stripe pattern (interference fringes pattern) to be formed on the work W. In other words, it is possible to change the pitch of the resist pattern (dot density in the resist pattern) which is obtained upon applying the exposure process a plurality of times.

Figure 19:
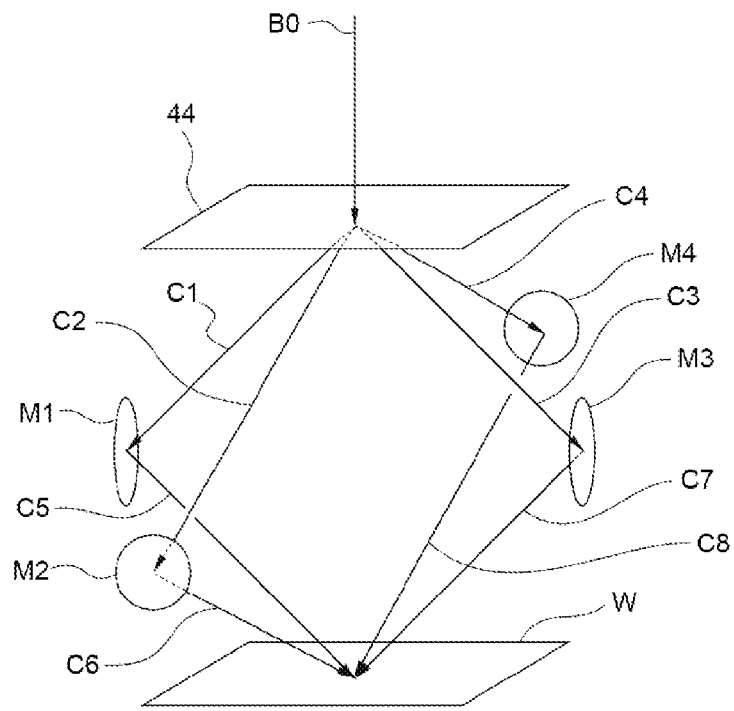
FIG. 19 is a schematic view useful to describe a multi-beam interference exposure method.

Although the above-described embodiments deal with the two-beam interference exposure, the present invention is not limited in this regard. For example, the beam from the light source may be divided into three or more beams, and these beams may simultaneously be directed to the substrate. In other words, so-called multi-beam interference exposure may be used in the present invention. An optical element for dividing the beam may include a diffracting element that divides, for example, a laser beam into a plurality of beams. For example, if the multi-beam interference exposure should provide the same result as the two-beam interference exposure of the first embodiment, with the angle difference 6 between the first interference beam and the second interference beam being 90 degrees, then four beams may be used as shown in FIG. 19. Specifically, a single beam (laser beam) B0 from the light source is divided into four beams C1, C2, C3 and C4 by a beam splitting element 44 in FIG. 19. The beam splitting element 44 may be a diffraction element. The four branch beams C1-C4 are reflected by the associated four mirrors M1, M2, M3 and M4, and become four reflection beams C5, C6, C7 and C8, respectively. The four reflection beams C5-C8 are directed to the work W. The triangle defined by the beam C1, its reflection beam C5 and the normal line from the work W is 90-degree spaced from the triangle defined by the beam C2, its reflection beam C6 and the normal line from the work W when viewed from the top. The triangle defined by the beam C2, its reflection beam C6 and the normal line from the work W is 90-degree spaced from the triangle defined by the beam C3, its reflection beam C7 and the normal line from the work W when viewed from the top. The triangle defined by the beam C3, its reflection beam C7 and the normal line from the work W is 90-degree spaced from the triangle defined by the beam C4, its reflection beam C8 and the normal line from the work W when viewed from the top. The angle defined by the two opposite reflection beams C5 and C7 is 2θ, and the angle defined by the two opposite branch beams C6 and C8 is 2°. The arrangement of the optical components is decided to satisfy the above-mentioned numerical values.

While certain embodiments have been described, these embodiments have been presented by way of example only, and are not intended to limit the scope of the present invention. The novel apparatuses (devices) and methods thereof described herein may be embodied in a variety of other forms; furthermore, various omissions, substitutions and changes in the form of the apparatuses (devices) and methods thereof described herein may be made without departing from the gist of the present invention. The accompanying claims and their equivalents are intended to cover such forms or modifications as would fall within the scope and gist of the present invention.

The present application is based upon and claims the benefit of a priority from Japanese Patent Application No. 2015-187429, filed on Sep. 24, 2015, and the entire contents of which are incorporated herein by reference.

What is claimed is:

1. A method comprising:
dividing a single beam emitted from a coherent light source into at least two branch beams;
causing the at least two branch beams to cross each other at a predetermined interference angle thereby generating an interference pattern;
selecting a plurality of exposure areas based on a target exposure area of a substrate such that when said plurality of exposure areas overlap each other in a predetermined stepwise manner, said plurality of exposure areas become the target exposure area;
placing a light blocking member, which has a light transmitting portion having a predetermined shape, above the substrate with a predetermined gap;
irradiating the first of said plurality of exposure areas with the interference pattern such that the first of said plurality of exposure areas is irradiated with the interference pattern which passes through the light transmitting portion of the light blocking member to form a fine pattern and such that neighboring areas of the first of said plurality of exposure areas in a first direction are irradiated with only one of the at least two branch beams, the first direction being a direction perpendicular to an extending direction of interference fringes in each said exposure area;

conveying the substrate in a stepwise manner such that the second and subsequent of said plurality of exposure areas overlap each other in the predetermined stepwise manner upon repeating said irradiating;

causing a line-to-line pitch of the interference fringes in one of said plurality of exposure areas to align with the line-to-line pitch of the interference fringes in a next one of said plurality of exposure areas upon repeating said irradiating and said conveying;

determining how many times said irradiating and said conveying are repeated in order to achieve that variations in a line width of a fine pattern, which is formed on the substrate by the interference fringes upon repeating said irradiating and said conveying, become equal to or smaller than an allowable value; and repeating said irradiating and said conveying said determined times such that said plurality of exposure areas overlap each other in the predetermined stepwise manner in the first direction, and the line-to-line pitch of the interference fringes in one exposure area aligns with the line-to-line pitches of the interference fringes in subsequent exposure areas, wherein the repeating the irradiating and the conveying the determined times is carried out such that a plurality of irradiance distributions are produced, and wherein each of the plurality of irradiance distributions has a Gaussian distribution.

2. The method according to claim 1, wherein said dividing a single beam divides the single beam from the coherent light source into two branch beams, and said causing the at least two branch beams causes the two branch beams to cross each other at the predetermined interference angle thereby generating the interference pattern, each said exposure area has two sides parallel in the first direction, and said conveying is preformed such that said plurality of exposure areas do not overlap each other in a second direction but are present side by side in the second direction, the second direction being perpendicular to the first direction and generally parallel to the extending direction of the interference fringes.

3. The method according to claim 1, wherein said repeating said irradiating and said conveying said determined times is carried out such that variations in an irradiance distribution integrated on the target exposure area of the substrate upon repeating said irradiating and said conveying become equal to or smaller than an allowable value.

4. The method according to claim 1 further comprising determining an amount of each stepwise movement of the substrate when the substrate is conveyed in the stepwise manner in said conveying, wherein said determining an amount of each stepwise movement determines said amount of each stepwise movement from a plurality of candidate values for the amount of each stepwise movement based on results obtained when said plurality of exposure areas of the substrate are irradiated with the interference pattern while the substrate is being conveyed in the stepwise manner, using said plurality of candidate values for the amount of each stepwise movement.

5. The method according to claim 1, wherein said plurality of exposure areas are a plurality of rectangular exposure areas.

6. The method according to claim 1, wherein said plurality of exposure areas are arranged in an overlapping manner over the entire target exposure area of the substrate without gaps.

7. The method according to claim 1, wherein said plurality of exposure areas are discretely arranged over the target exposure area of the substrate.

8. The method according to claim 1, wherein said irradiating includes irradiating each said exposure area with a first shot of the interference pattern and further irradiating the same exposure area with a second shot of the interference pattern such that a longitudinal direction of the interference fringes of the first shot crosses a longitudinal direction of the interference fringes of the second shot at a predetermined angle.

9. The method according to claim 8, wherein the substrate is turned by a predetermined angle after the first shot, and then the same exposure area is irradiated with said second shot.

10. A method of manufacturing a structure on a substrate, the structure having a fine pattern, the fine pattern including a plurality of concave portions and/or a plurality of concave portions, the fine pattern being formed on a surface of the substrate or a surface of a functional material layer, the functional material layer being formed on the substrate, the method comprising:

forming a photosensitive material layer on the surface of the substrate or the surface of the functional material layer;

dividing a single beam emitted from a coherent light source into at least two branch beams;

causing the at least two branch beams to cross each other at a predetermined interference angle thereby generating an interference pattern, with longitudinal directions of interference fringes of the interference pattern crossing each other at a predetermined angle;

applying an exposure process to the photosensitive material layer with the interference pattern;

removing those areas of the photosensitive material layer which are irradiated with the interference pattern or removing those areas of the photosensitive material layer which are not irradiated with the interference pattern, after the exposure process with the interference pattern, thereby forming the fine pattern in the photosensitive material layer; and applying an etching process to the substrate or the functional material layer with the fine pattern of the photosensitive material layer, thereby creating a fine pattern on the surface of the substrate or the surface of the functional material layer, said applying an exposure process repeating a first substep of irradiating the substrate with the interference pattern and a second substep of conveying the substrate to expose the photosensitive material layer, the method also comprising selecting a plurality of exposure areas based on a target exposure area of the photosensitive material layer such that when said plurality of exposure areas overlap each other in a predetermined stepwise manner, said plurality of exposure areas become the target exposure area;

the method also comprising placing a light blocking member, which has a light transmitting portion having a predetermined shape, above the photosensitive material layer with a predetermined gap;

the first substep including irradiating the first of said plurality of exposure areas with the interference pattern such that the first of said plurality of exposure areas is irradiated with the interference pattern which passes through the light transmitting portion of the light blocking member and such that neighboring areas of the first of said plurality of exposure areas in a first direction are irradiated with only one of the at least two branch beams, the first direction being a direction perpendicular to an extending direction of interference fringes in each said exposure area, the second substep including conveying the substrate in a stepwise manner to select the subsequent one of said plurality of exposure areas such that said plurality of exposure areas overlap each other in the predetermined stepwise manner upon repeating the first substep and the second substep, the method also comprising causing a line-to-line pitch of interference fringes in one of said plurality of exposure areas to align with the line-to-line pitch of the interference fringes in a next one of said plurality of exposure areas, upon repeating the first substep and the second substep, the method also comprising determining how many times said first substep and said second substep are repeated in order to achieve that variations in a line width of the fine pattern become equal to or smaller than an allowable value, and the method also comprising repeating said first substep and said second substep the determined times such that said plurality of exposure areas overlap each other in the predetermined stepwise manner in the first direction, and the line-to-line pitch of the interference fringes in one exposure area aligns with the line-to-line pitches of the interference fringes in subsequent exposure areas, wherein the repeating the irradiating and the conveying the determined times is carried out such that a plurality of irradiance distributions are produced, and wherein each of the plurality of irradiance distributions has a Gaussian distribution.

11. The method according to claim 10 further comprising, prior to said applying an etching process, applying a heat treatment to the fine pattern formed in the photosensitive material layer, thereby shaping the fine pattern to a desired fine pattern.

12. The method according to claim 11, wherein the photosensitive material layer is made from a material having a glass-transition temperature, and said applying a heat treatment includes heating the fine pattern at a temperature higher than the glass-transition temperature.

13. The method according to claim 10, wherein said applying the exposure process includes applying the exposure process to the photosensitive material layer a plurality of times, and a longitudinal direction of the interference fringes in a first exposure process crosses a longitudinal direction of the interference fringes in a second and subsequent exposure processes at a predetermined angle.

14. The method according to claim 13, wherein said applying the exposure process to the photosensitive material layer with the interference pattern is carried out, using two overlapping exposures, which have two fringe directions, with an angle of 90 degrees between the two fringe directions, such that said removing those areas of the photosensitive material layer can form the fine pattern that has the plurality of convex portions and/or the plurality of concave portions in a square array.

15. The method according to claim 13, wherein said applying the exposure process to the photosensitive material layer with the interference pattern is carried out, using three overlapping exposures, which have three fringe directions, with an angle of 60 degrees between each two of the three fringe directions, such that said removing those areas of the photosensitive material layer can form the fine pattern that has the plurality of convex portions and/or the plurality of concave portions in a trigonal array.

16. The method according to claim 13, wherein said applying the exposure process with the interference pattern includes applying a first exposure process and at least one subsequent exposure process, and the method further comprises turning the substrate by a predetermined angle after said applying the first exposure process to the photosensitive material layer with the interference pattern and then applying said at least one subsequent exposure process with the interference pattern.

17. A method of manufacturing a structure on a substrate, the structure having a fine pattern, the fine pattern including a plurality of concave portions and/or a plurality of concave portions, the fine pattern being formed on a surface of the substrate or a surface of a functional material layer, the functional material layer being formed on the substrate, the method comprising:

dividing a single beam emitted from a coherent light source into at least two branch beams;

causing the at least two branch beams to cross each other at a predetermined interference angle thereby generating an interference pattern, with longitudinal directions of interference fringes of the interference pattern crossing each other at a predetermined angle; and applying an exposure process to the substrate or the functional material layer with the interference pattern, thereby removing some portions from the substrate or the functional material layer to form the fine pattern, said applying an exposure process including a first substep of irradiating the substrate with the interference pattern and a second substep of conveying the substrate to expose the substrate or the functional material layer, the method also comprising selecting a plurality of exposure areas based on a target exposure area of the substrate or the functional material layer such that when said plurality of exposure areas overlap each other in a predetermined stepwise manner, said plurality of exposure areas become the target exposure area;

the method also comprising placing a light blocking member, which has a light transmitting portion having a predetermined shape, above the substrate or the functional material layer with a predetermined gap;

the first substep including irradiating the first of said plurality of exposure areas with the interference pattern such that the first of said plurality of exposure areas is irradiated with the interference pattern which passes through the light transmitting portion of the light blocking member and such that neighboring areas of the first of said plurality of exposure areas in a first direction are irradiated with only one of the at least two branch beams, the first direction being a direction perpendicular to an extending direction of interference fringes in each said exposure area, the second substep including conveying the substrate in a stepwise manner to select the subsequent one of said plurality of exposure areas such that said plurality of exposure areas overlap each other in the predetermined stepwise manner upon repeating the first substep and the second substep, the method also comprising causing a line-to-line pitch of interference fringes in one of said plurality of exposure areas to align with the line-to-line pitch of the interference fringes in a next one of said plurality of exposure areas upon repeating the first substep and the second substep, the method also comprising determining how many times said first substep and said second substep are repeated in order to achieve that variations in a line width of the fine pattern become equal to or smaller than an allowable value, and the method also comprising repeating said first substep and said second substep the determined times, wherein the repeating the irradiating and the conveying the determined times is carried out such that a plurality of irradiance distributions are produced, and wherein each of the plurality of irradiance distributions has a Gaussian distribution.

18. A method of manufacturing a structure on a substrate, the structure having periodic features on a surface of the substrate or a surface of a functional material layer, the functional material layer being formed on the substrate, the method comprising:

dividing a single beam emitted from a coherent light source into at least two branch beams;

causing the at least two branch beams to cross each other at a predetermined interference angle thereby generating an interference pattern, with longitudinal directions of interference fringes of the interference pattern crossing each other at a predetermined angle; and applying an exposure process to the substrate or the functional material layer with the interference pattern, thereby imparting a fine pattern into the substrate or the functional material layer based on the interference fringes of the interference pattern;

said applying an exposure process including a first substep of irradiating the substrate with the interference pattern and a second substep of conveying the substrate to expose the substrate or the functional material layer, the method also comprising selecting a plurality of exposure areas based on a target exposure area of the substrate or the functional material layer such that when said plurality of exposure areas overlap each other in a predetermined stepwise manner, said plurality of exposure areas become the target exposure area;

the method also comprising placing a light blocking member, which has a light transmitting portion having a predetermined shape, above the substrate or the functional material layer with a predetermined gap;

the first substep including irradiating the first of said plurality of exposure areas with the interference pattern such that the first of said plurality of exposure areas is irradiated with the interference pattern which passes through the light transmitting portion of the light blocking member and such that neighboring areas of the first of said plurality of exposure areas in a first direction are irradiated with only one of the at least two branch beams, the first direction being a direction perpendicular to an extending direction of interference fringes in each said exposure area, the second substep including conveying the substrate in a stepwise manner to select the subsequent one of said plurality of exposure areas such that said plurality of exposure areas overlap each other in the predetermined stepwise manner upon repeating the first substep and the second substep, the method also comprising causing a line-to-line pitch of interference fringes in one of said plurality of exposure areas to align with the line-to-line pitch of the interference fringes in a next one of said plurality of exposure areas upon repeating the first substep and the second substep, the method also comprising determining how many times said first substep and said second substep are repeated in order to achieve that variations in a line width of the fine pattern become equal to or smaller than an allowable value, and the method also comprising repeating said first substep and said second substep the determined times, wherein the repeating the irradiating and the conveying the determined times is carried out such that a plurality of irradiance distributions are produced, and wherein each of the plurality of irradiance distributions has a Gaussian distribution.

\* \* \* \* \*